United States Patent
Hirai et al.

(10) Patent No.: US 7,582,333 B2
(45) Date of Patent: Sep. 1, 2009

(54) PATTERN FORMING METHOD, PATTERN FORMING APPARATUS, METHOD OF MANUFACTURING DEVICE, CONDUCTIVE FILM WIRING, ELECTRO-OPTICAL DEVICE, AND ELECTRONIC APPARATUS

(75) Inventors: Toshimitsu Hirai, Chino (JP); Hironori Hasei, Okaya (JP)

(73) Assignee: Seiko Epson Corporation (JP)

( * ) Notice: Subject to any disclaimer, the term of this patent is extended or adjusted under 35 U.S.C. 154(b) by 870 days.

(21) Appl. No.: 10/797,591

(22) Filed: Mar. 10, 2004

(65) Prior Publication Data

US 2004/0241586 A1    Dec. 2, 2004

(30) Foreign Application Priority Data

Mar. 11, 2003   (JP)  ............................. 2003-065323
Feb. 6, 2004    (JP)  ............................. 2004-031048

(51) Int. Cl.
*B05D 1/02*    (2006.01)
*B05D 1/36*    (2006.01)
*B05D 5/06*    (2006.01)

(52) U.S. Cl. ................ 427/421.1; 427/299; 427/256; 427/258; 427/261; 427/265; 427/402; 427/404; 427/419.1; 427/427; 427/427.4; 427/58; 427/66

(58) Field of Classification Search ............ 427/58, 427/66, 299, 256, 258, 261, 265, 402, 404, 427/419.1, 427, 427.4

See application file for complete search history.

(56) References Cited

U.S. PATENT DOCUMENTS

| | | | | |
|---|---|---|---|---|
| 5,670,205 | A  * | 9/1997  | Miyazaki et al. | 427/64 |
| 6,154,981 | A  * | 12/2000 | Heikkila et al. | 34/451 |
| 6,179,400 | B1 * | 1/2001  | Akahira et al. | 347/1 |
| 6,501,663 | B1   | 12/2002 | Pan | |
| 6,599,582 | B2   | 7/2003  | Kiguchi et al. | |
| 6,720,119 | B2 * | 4/2004  | Ohtsu et al. | 430/7 |
| 6,734,029 | B2   | 5/2004  | Furusawa | |
| 7,198,816 | B2 * | 4/2007  | Masuda et al. | 427/97.3 |
| 2003/0003231 | A1 * | 1/2003 | Kiguchi et al. | 427/282 |

FOREIGN PATENT DOCUMENTS

| | | |
|---|---|---|
| JP | 10-312743 | 11/1998 |
| JP | 11-204529 | 7/1999 |

(Continued)

OTHER PUBLICATIONS

Communication from Japanese Patent Office regarding counterpart application.

(Continued)

*Primary Examiner*—Timothy H Meeks
*Assistant Examiner*—Jimmy Lin
(74) *Attorney, Agent, or Firm*—Harness, Dickey & Pierce, P.L.C.

(57) ABSTRACT

A pattern forming method is provided which discharges droplets of a liquid material on a substrate and forms a film pattern W. The method comprises a first step of forming a central pattern W1 of the film pattern W on the substrate, a second step of forming a first side pattern W2 with respect to the central pattern W1, and a third step of forming a second side pattern W3 with respect to the central part W1.

11 Claims, 13 Drawing Sheets

FOREIGN PATENT DOCUMENTS

| | | |
|---|---|---|
| JP | 11-274671 | 10/1999 |
| JP | 2000-094755 | 4/2000 |
| JP | 2000-216330 | 8/2000 |
| JP | 2000-296357 | 10/2000 |
| JP | 2002-164635 | 6/2002 |
| JP | 2006-034837 | 2/2006 |

OTHER PUBLICATIONS

Communication from Chinese Patent Office regarding corresponding application.
Patent Abstracts of Japan regarding Publication No. 11-274671 published Oct. 8, 1999.
Patent Abstracts of Japan regarding Publication No. 2000-216330 published Aug. 4, 2000.

* cited by examiner

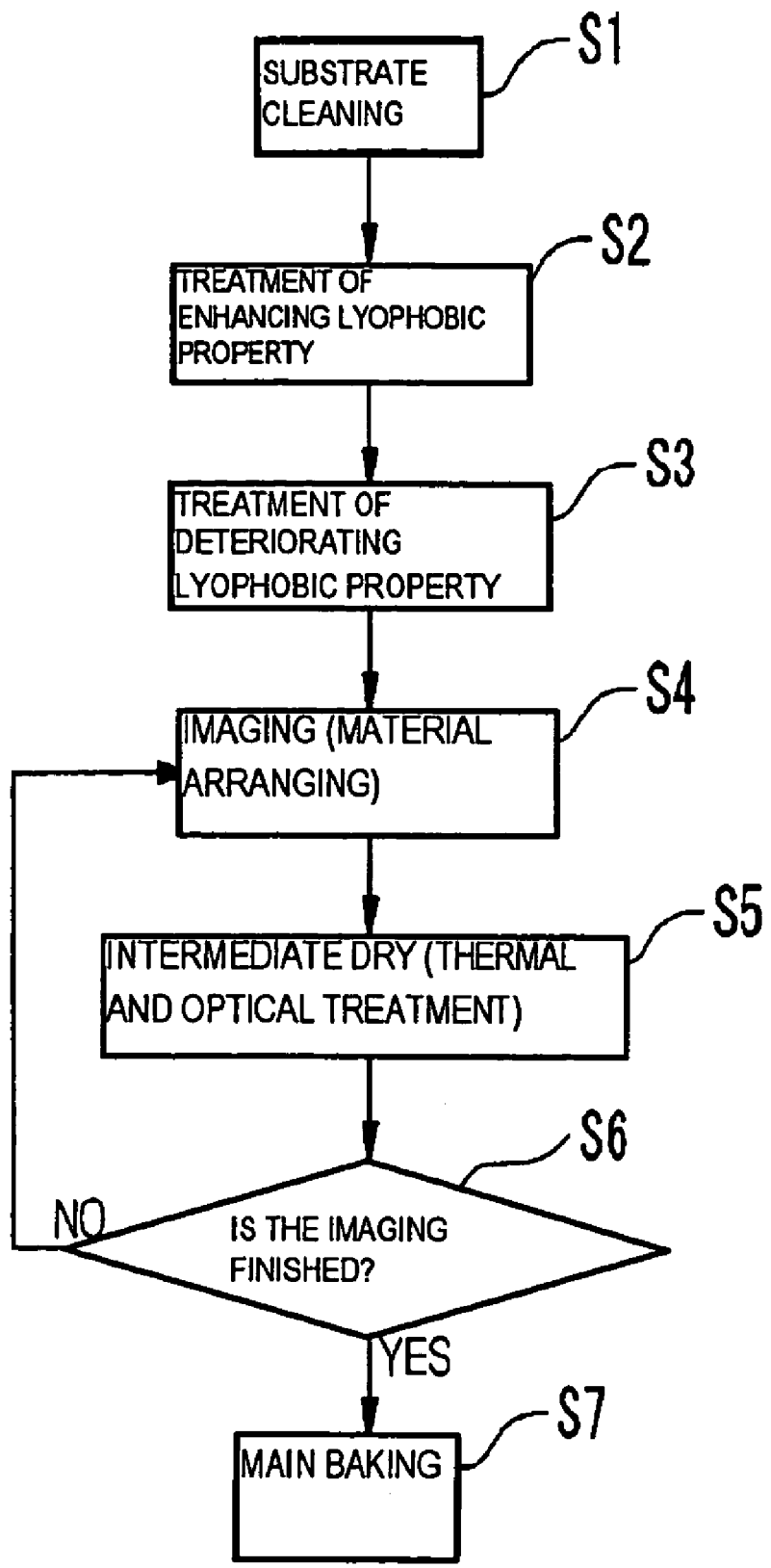

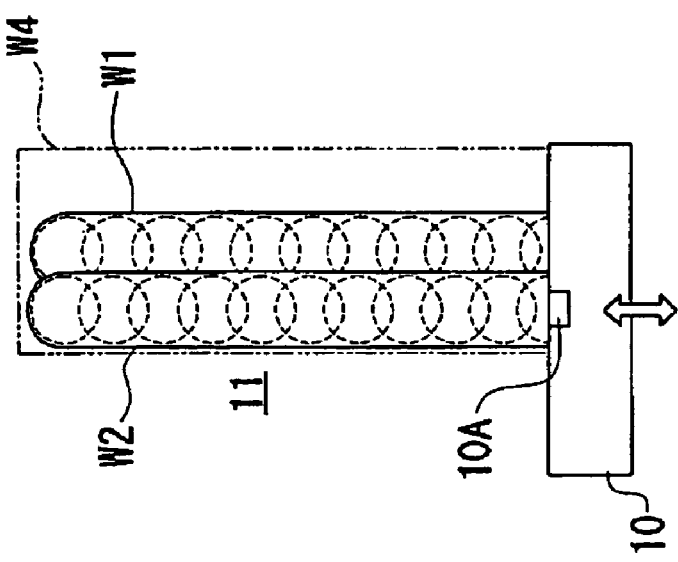
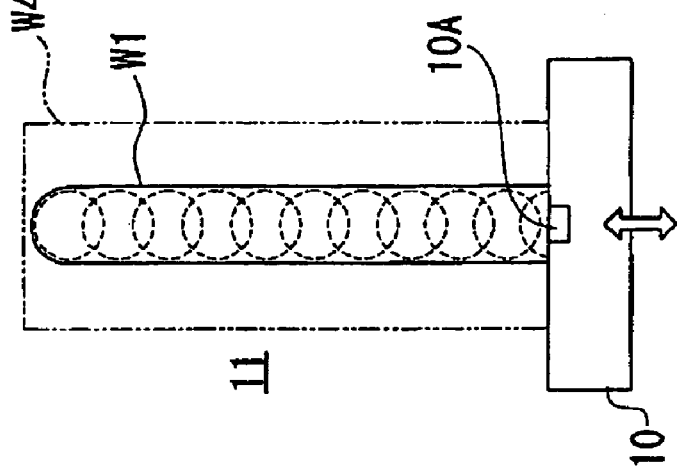

PATTERN FORMING METHOD, PATTERN FORMING APPARATUS, METHOD OF MANUFACTURING DEVICE, CONDUCTIVE FILM WIRING, ELECTRO-OPTICAL DEVICE, AND ELECTRONIC APPARATUS

RELATED APPLICATIONS

This application claims priority to Japanese Patent Application Nos. 2003-065323 filed Mar. 11, 2003 and 2004-031048 filed Feb. 6, 2004 which are hereby expressly incorporated by reference herein in their entireties.

BACKGROUND

1. Technical Field

The present invention relates to a pattern forming method and a pattern forming apparatus for forming a film pattern by arranging droplets of a liquid material on a substrate, a method of manufacturing a device, conductive film wiring, an electro-optical device, and an electronic apparatus.

2. Background Art

Photolithographic methods have been widely used in methods of manufacturing devices having a fine wiring pattern (film pattern), such as a semiconductor integrated circuit (IC). However, a lot of attention has been paid to a method of manufacturing a device using a droplet discharge method. The droplet discharge method has an advantage in that the consumption of a liquid material is less wasteful and the amount or position of the liquid material disposed on the substrate is easily controlled. Techniques concerning a droplet discharge method are disclosed in Japanese Unexamined Patent Application Publication No. 11-274671 and Japanese Unexamined Patent Application Publication No. 2000-216330.

However, there is a problem in that it is difficult to enlarge the width of a film pattern in a technique of arranging a liquid material on a substrate by making the liquid material as droplets. In other words, in order to enlarge the width of a film pattern, if the volume of one droplet is increased or the total amount of a liquid material arranged on the substrate is increased, accumulation (bulging) of liquid occurs, which may cause troubles, such as disconnection or short circuit.

The present invention has been made in view of the above circumstances. Accordingly, an object of the present invention is to provide a pattern forming method and pattern forming apparatus in which the occurrence of troubles, such as bulging, can be suppressed to enlarge the width of a film pattern, and a method of manufacturing a device. Another object of the present invention is to provide a conductive film wiring whose width is large and whose electric conductivity is good, an electro-optical device in which troubles of a wiring portion, such as disconnections or short circuits, hardly occur, and an electronic apparatus using the same.

SUMMARY

In order to solve the above problem, the present invention provides a pattern forming method for forming a film pattern by arranging droplets of a liquid material on a substrate, the method comprising a first step of forming a central part of the film pattern on the substrate using the droplets, a second step of forming one side with respect to the formed central part, and a third step of forming the other side with respect to the formed central part.

According to the present invention, when a film pattern is formed, a central part thereof is formed, and then, one side and the other side thereof are formed adjacent to the central part. Thus, even though the volume of droplets during one arrangement operation is small, a film pattern having a large width can be easily formed. In addition, since the volume of droplets during one arrangement operation can be decreased, the occurrence of troubles, such as bulging, can be suppressed.

In the pattern forming method according to the present invention, the droplets are arranged on the substrate so that the droplets overlap with at least a part of the central part formed on the substrate, thereby forming the sides.

According to the present invention, parts of droplets arranged so as to form the sides overlap with the central part and are securely connected to the central part. Thus, the occurrence of troubles such as a discontinuous part being formed in the film pattern can be suppressed.

In the pattern forming method according to the present invention, forming the sides using a plurality of droplets comprises a first arrangement step of arranging the plurality of droplets not to overlap with one another on the substrate and a second arrangement step of arranging droplets between the plurality of droplets arranged on the substrate in the first arrangement step.

According to the present invention, when the sides are formed by arranging a plurality of droplets on the substrate, a gap is provided between the droplets in the first arrangement step, and then, droplets are arranged to fill the gap between the droplets in the second arrangement step. Thus, the sides can be continuously formed using a plurality of droplets while the occurrence of bulging can be suppressed. In other words, if droplets are arranged such that they are continuously discharged and connected to one another, bulging easily occurs. However, the arrangement operation (discharge operation) is performed several times in which, during the first arrangement operation, droplets are thinned out and arranged, and during the second arrangement operation, a gap between the droplets on the substrate is filled in (e.g., interpolated). Thus, the occurrence of bulging can be suppressed, and the side patterns (film pattern) can be securely and continuously formed using a plurality of droplets.

In the pattern forming method according to the present invention, arrangement conditions of the droplets in the first, second, and third steps are set differently.

According to the present invention, for example, the arrangement conditions of each step are changed according to design value information of a film pattern or a property of a liquid material such that a good pattern formation operation can be efficiently performed.

For example, the arrangement intervals of the droplets on the substrate in the first, second, and third steps are set to different values. Thus, processing time can be reduced and the occurrence of troubles, such as bulging, can be suppressed.

In addition, the volumes of the droplets in the first, second, and third steps are set to different values. Thus, since bulging hardly occurs due to the property of a liquid material to be used, the volume of the droplets during the first arrangement operation (discharge operation) is increased, whereby throughput improvement can be achieved.

In the pattern forming method according to the present invention, the method further comprises a surface treatment step of adjusting a lyophobic property of the surface of the substrate before arranging the droplets on the substrate.

According to the present invention, before arranging droplets on the substrate, surface treatment of adjusting the lyophobic property of the substrate is performed. Thus, droplets can be arranged on the substrate at a desired contact angle, the thickness of a thin film can be increased, a pattern shape can be stabilized, and pattern formation can be smoothly performed.

Here, lyophobic treatment for giving a lyophobic property means treatment for giving a property that represents no affinity with the liquid material.

In the pattern forming method according to the present invention, the liquid material comprises conductive particles. As a result, a wiring pattern having conductivity can be formed.

The present invention also provides a pattern forming apparatus according to the present invention which has a droplet discharge device for arranging droplets of a liquid material on a substrate and forms a film pattern using the droplets, the droplet discharge device forms a central part of the film pattern on the substrate using the droplets and then forms one side and the other side with respect to the central part formed on the substrate.

According to the present invention, the occurrence of troubles, such as bulging, can be suppressed, and a film pattern having a large width can be easily formed.

The present invention also provides a method of manufacturing a device having a wiring pattern comprising a material arrangement step of arranging droplets of a liquid material on a substrate, wherein the material arrangement step comprises a first step of forming a central part of the film wiring on the substrate using the droplets, a second step of forming one side with respect to the formed central part, and a third step of forming the other side with respect to the formed central part.

According to the present invention, since the occurrence of troubles, such as bulging, can be suppressed, and a film pattern having a large width can be easily formed, a device having a wiring pattern whose electric conductivity is good, can be provided.

The present invention also provides a conductive film wiring formed using the pattern forming apparatus. According to the present invention, conductive film wiring whose electric conductivity is good and whose width is enlarged, can be provided.

The present invention also provides an electro-optical device comprising the aforementioned conductive film wiring. In addition, the present invention also provides an electronic apparatus comprising the aforementioned electro-optical device. According to the present invention, since the electronic apparatus comprises the conductive film wiring whose electric conductivity is good, defects such as a disconnection or short circuit of a wiring portion hardly occur.

Here, the electro-optical device may include a plasma display device, a liquid crystal display device, and an organic field emission display device.

The droplet discharge methods of the droplet discharge device (ink jet device) may include a piezo-method of discharging a liquid material by a variation in volume of a piezoelectric element and a method of discharging droplets of a liquid material by rapidly generating vapor due to applied heat.

The liquid material means a medium having a viscosity that can be discharged through a discharge nozzle of a droplet discharge head (e.g., ink jet head). Whether the liquid material is watery or oily does not matter. Any liquid material may be used as long as fluidity (viscosity) that can be discharged through a nozzle is given thereto, and any fluid in which a solid material is mixed, may be used as long as it has fluidity as a whole. In addition, a material included in the liquid material may be a material dispersed in a solvent as particles as well as a material heated and melted above a melting point, or a material to which dyes, pigments or other functional materials may be added in addition to a solvent. In addition, the substrate may be a flat substrate or a curved substrate. Further, the hardness of a pattern formation surface need not be large, and the pattern formation surface may be formed of glass or plastics, metal, or a material having flexibility, such as film, paper, or rubber.

BRIEF DESCRIPTION OF THE DRAWINGS

FIG. 1 is a flowchart illustrating a pattern forming method according to an embodiment of the present invention.

FIGS. 2A-C are mimetic diagrams illustrating the pattern forming method according to the embodiment of the present invention.

DETAILED DESCRIPTION

Pattern Forming Method

Figure 3A:
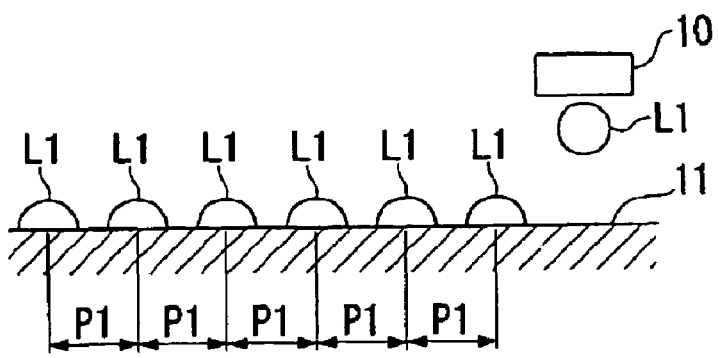
FIGS. 3A-C are mimetic diagrams illustrating the pattern forming method according to the embodiment of the present invention.

Hereinafter, a pattern forming method according to the present invention will be described with reference to the accompanying drawings. FIG. 1 is a flowchart of a pattern forming method according to an embodiment of the present invention.

Here, in the present embodiment, a case where a conductive film wiring pattern is formed on a substrate will be described.

In FIG. 1, the pattern forming method according to the present embodiment comprises a step (step S1) of cleaning a substrate on which droplets of a liquid material are arranged, using a predetermined solvent; a step (step S2) of performing lyophobic treatment that constitutes a part of a surface treatment step of the substrate; a step (step S3) of performing lyophobic property lowering treatment that constitutes a part of the surface treatment step of adjusting a lyophobic property of the surface of the substrate on which lyophobic treatment is performed; a material arrangement step (step S4) of arranging droplets of the liquid material including a material for forming a conductive film wiring, on the substrate on which the surface treatment step is performed, based on a droplet discharge method and forming a film pattern; an intermediate drying step (step S5) including heat/light treatment for removing at least a part of a solvent component of the liquid material arranged on the substrate; and a baking step (step S7) of baking the substrate on which a predetermined film pattern is drawn. The pattern forming method further comprises a step (step S6) of determining whether a predetermined pattern drawing has been completed after the intermediate drying step, and if the pattern drawing has been completed, the baking step is performed, and if the pattern drawing has not been completed, the material arrangement step is repeated.

Next, the material arrangement step (step S4) based on the droplet discharge method, which is a part of the present invention, will be described with reference to FIGS. 2 to 8.

The material arrangement step according to the present embodiment is a step of discharging droplets of a liquid material including a material for forming a conductive film wiring onto a substrate from a droplet discharge head of a droplet discharge device so that a linear film pattern (wiring pattern) W can be formed on the substrate. The liquid material is a liquid material in which conductive particles, such as metal, as the material for forming the conductive film wiring are dispersed in a dispersion medium.

In FIGS. 2A-C, the material arrangement step (step S4), which is a step of discharging droplets of a liquid material onto a substrate 11 from a discharge nozzle 10A of a droplet discharge head 10 of a droplet discharge device, comprises a first step (see FIG. 2(a)) of forming a line width direction central part (central pattern) W1 of a film pattern W on the substrate 11, a second step (see FIG. 2(b)) of forming one side W2 (first side pattern) with respect to the central pattern W1 formed on the substrate 11, and a third step (see FIG. 2(c)) of forming the other side (second side pattern) W3 with respect to the central part W1 formed on the substrate 11. By performing the first, second, and third steps, the linear film pattern W of FIG. 2(c) is formed.

In the first step, as shown in FIG. 2(a), droplets of a liquid material are discharged from the droplet discharge head 10 and are arranged on the substrate 11 at predetermined intervals (pitch). The arrangement operation of the droplets is repeatedly performed so that the linear central pattern W1 that constitutes a part of the film pattern W is formed in the central part of a region W4 in which the film pattern W is to be formed, on the substrate 11. In addition, since the surface of the substrate 11 is treated in advance to have a desired lyophobic property by steps S2 and S3, the spread of the droplets arranged on the substrate 11 is suppressed. Therefore, a pattern shape can be surely controlled in a good state, and the thickness of a thin film can be easily increased.

Here, after droplets to form the central pattern W1 are arranged on the substrate 11, in order to remove a dispersion medium, intermediate drying (step S5) is performed, if necessary. The intermediate drying may be light treatment using lamp annealing other than general heat treatment using a heating apparatus, such as a hot plate, an electric furnace, or a hot blast generator.

Next, in the second step, as shown in FIG. 2(b), droplets of a liquid material are discharged from the droplet discharge head 10 so that the first linear side pattern W2 adjacent to one side of the central pattern W1 is formed. Here, when forming the first side pattern W2, the droplet discharge head 10 discharges droplets so that the discharged droplets overlap with at least a part of the central pattern W1 formed on the substrate 11. As a result, the droplets to form the central pattern W1 and the first side pattern W2 are surely connected to each other, and a discontinuous part of a material for forming a conductive film wiring is not generated in the formed film pattern W. Since, in the second step, the droplets are arranged on the substrate 11 at predetermined pitches and the arrangement operation is repeatedly performed, the first side pattern W2 that constitutes a part of the film pattern W is formed at one side of the region W4 in which the film pattern W is to be formed, and the central pattern W1 and the first side pattern W2 are integrated with each other.

Here, after the droplets to form the first side pattern W2 are arranged on the substrate 11, in order to remove a dispersion medium, intermediate drying (step S5) is performed, if necessary.

Next, in the third step, as shown in FIG. 2(c), droplets of a liquid material are discharged from the droplet discharge head 10 so that the second linear side pattern W3 adjacent to the one side of the central pattern W1 is formed. Here, when forming the second side pattern W3, the droplet discharge head 10 discharges droplets so that the discharged droplets overlap with at least a part of the central pattern W1 formed on the substrate 11. As a result, the droplets to form the central pattern W1 and the second side pattern W3 are surely connected to each other, and a discontinuous part of a material for forming a conductive film wiring is not formed in the formed film pattern W. In this way, the central pattern W1 and the second side pattern W3 are integrated with each other, and the three line patterns W1, W2, and W3 are integrated with each other, thereby forming the film pattern W having a large width. In the third step, the droplets are arranged on the substrate 11 at predetermined pitches, and the arrangement operation is repeatedly performed so that the second side pattern W3 that constitutes a part of the film pattern W is formed at the other side of the region W4 in which the film pattern W is to be formed.

In this case, the discharge position (distance between the droplets and the central pattern W) of the droplets discharged using the second and third steps can be adjusted to the line width of the final linear film pattern W. In addition, the height (thickness) of the plurality of patterns W1, W2, and W3, which are formed using each of the first, second, and third steps, from the surface of the substrate 11 is varied so that the layer thickness of the film pattern W after the plurality of patterns W1, W2, and W3 are integrated with each other, can be controlled.

Next, a method of forming a linear central pattern W1 and side patterns W2 and W3 will be described with reference to FIGS. 3(a) to 3(c).

First, as shown in FIG. 3(a), droplets L1 discharged through a droplet discharge head 10 are sequentially arranged on a substrate 11 at predetermined intervals. In other words, the droplet discharge head 10 arranges the droplets L1 on the substrate 11 so as not to overlap with one another (first arrangement step). In the present embodiment, an arrangement pitch P1 of the droplets L1 is set to be larger than the diameter of the droplets L1 immediately after being arranged on the substrate 11. As a result, the droplets L1 immediately after being arranged on the substrate 11 are prevented from overlapping with one another (from contacting one another), and the droplets L1 are combined with one another and are prevented from getting wet and spreading on the substrate 11. In addition, the arrangement pitch P1 of the droplet L1 is set to be less than twice the diameter of the droplet L1 immediately after being arranged on the substrate 11.

Here, after the droplets L1 are arranged on the substrate 11, in order to remove a dispersion medium, intermediate drying (step S5) may be performed, if necessary. As described above, the intermediate drying may be light treatment using lamp annealing other than general heat treatment using a heating apparatus, such as a hot plate, an electric furnace, and a hot blast generator. In this case, even though there is no difficulty in increasing the degree of heating or light scanning for removing the dispersion medium and changing a dispersion solution into a conductive layer, it is sufficient to remove some of the dispersion medium sufficiently.

Figure 3B:
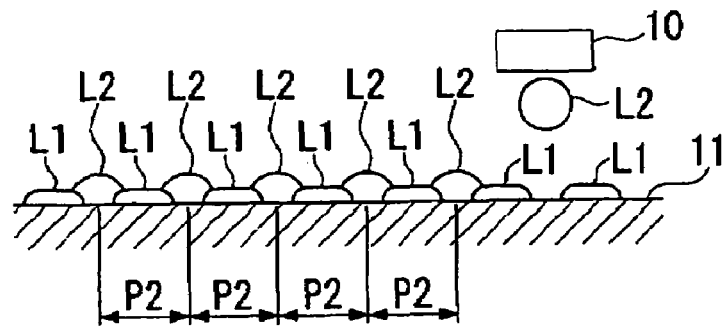

Next, as shown in FIG. 3(b), the arrangement operation of the above-described droplets is repeatedly performed. In other words, as in the previous step as shown in FIG. 3(a), the liquid material is discharged as droplets L2 from the droplet discharge head 10, and the droplets L2 are arranged on the substrate 11 at predetermined intervals. In this case, the volume of the droplets L2 (the amount of the liquid material per one droplet) and an arrangement pitch P2 thereof are the same as those of the previous droplets L1. The arrangement position of the droplets L2 is shifted by a ½ pitch from the previous droplets L1, and the droplets L2 are arranged at intermediate positions relative to the previous droplets L1 arranged on the substrate 11 (second arrangement step).

As described above, the arrangement pitch P1 of the droplets L1 on the substrate 11 is larger than the diameter of the droplets L1 immediately after being arranged on the substrate 11. Therefore, the droplets L2 are arranged in the intermediate position of the droplets L1 so that parts of the droplets L2 overlap with the droplets L1, and a gap between the droplets L1 is filled with the overlapped droplets L2. In this case, the present droplets L2 and the previous droplets L1 contact one another. However, since the dispersion medium in the droplets L1 is completely or somewhat removed, there is less probability that the previous droplets and the present droplets are combined with one another and are spread on the substrate 11.

In addition, in FIG. 3(b), a position in which the arrangement of the droplets L2 begins, is at the same side (left side of FIG. 3(a)) as that of the previous step, but may be at a reverse side (right side). Discharge of droplets is performed during movement in each direction of a reciprocating operation so that the distance of movement of the droplet discharge head 10 relative to the substrate 11 from can be reduced.

After the droplets L2 are arranged on the substrate 11, in order to remove the dispersion medium, as in the previous step, intermediate drying can be performed, if necessary.

Figure 3C:
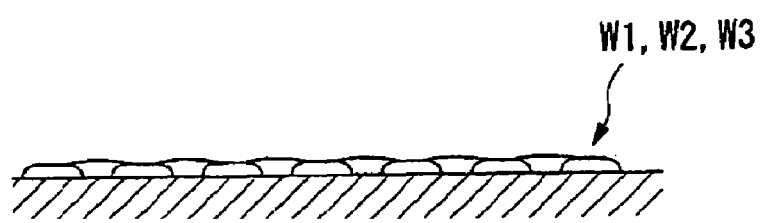

A series of such arrangement operations of droplets are repeatedly performed so that a gap between the droplets arranged on the substrate 11 is filled, and as shown in FIG. 3(c), linear and continuous central pattern W1 and side patterns W2 and W3 are formed on the substrate 11. In this case, the number of repetitions of the arrangement operation of the droplets is increased so that the droplets sequentially overlap with one another on the substrate 11, and the layer thickness of the patterns W1, W2, and W3, that is, the height (thickness) of the patterns from the surface of the substrate 11 is increased. The height (thickness) of the linear patterns W1, W2, and W3 is set according to a desired layer thickness required in a final film pattern, and the number of repetitions of the arrangement operation of the droplets is set according to the set layer thickness.

In addition, the method of forming linear patterns is not limited to those shown in FIGS. 3(a) to 3(c). For example, the arrangement pitch of droplets or the amount of shifting during repetition can be set arbitrarily, and the arrangement pitch on a substrate P of droplets when forming the patterns W1, W2, and W3 may be set to different values. For example, when the pitch of the droplets when forming the central pattern W1 is P1, the pitch of the droplets when forming the side patterns W2 and W3 may be a pitch larger than P1 (for example, P1×2). Of course, the pitch may be a pitch smaller than P1 (for example, P1×0.5). In addition, the volume of the droplets when forming the patterns W1, W2, and W3 may be set to different values. As an alternative, a droplet arrangement atmosphere (temperature or humidity) that is an atmosphere in which the substrate 11 or the droplet discharge head 10 is arranged in each of the first, second, and third steps, that is, the droplet arrangement atmosphere may be set differently.

In addition, in the present embodiment, the plurality of side patterns W2 and W3 may be formed one by one, or two side patterns may be simultaneously formed. Here, since the sum of the number of times of performing drying in a case where the plurality of side patterns W2 and W3 are formed one by one may be different from that in a case where two side patterns are simultaneously formed, drying conditions may be set not to damage the lyophobic property of the substrate 11.

In addition, in the present embodiment, one central pattern W1 is formed using the first step, but two or more central patterns W1 may be formed. Droplets are discharged to both sides of the plurality of central pattern W1 and are made continuous so that a film pattern having a larger line width can be easily formed.

Next, a method of discharging droplets on a substrate will be described with reference to FIGS. 4 to 7. As shown in FIGS. 4 to 7, a bit map having pixels which are a plurality of lattice-like unit areas in which droplets of a liquid material are discharged, is set on the substrate 11. The droplet discharge head 10 discharges droplets to a position of the pixels set as the bit map. Here, one pixel is set to be square. In addition, the droplet discharge head 10 discharges the droplets to the substrate 11 from the discharge nozzle 10A while scanning in a Y-axis direction. In the description with reference to FIGS. 4 to 7, "1" is given to the droplets discharged during first scanning, 2, 3, . . . , c, and n are given to the droplets discharged during second, third, . . . , and n-th scanning. In addition, hereinafter, each of droplets is discharged to a region (the region in which patterns are to be formed) indicated in gray of FIG. 4 so that the film pattern W is formed.

As shown in FIG. 4(a), during the first scanning, in order to form the central pattern W1, the droplets are discharged by opening one pixel in a region in which a central pattern is to be formed. Here, the droplets discharged to the substrate 11 land on the substrate 11 so that the droplets and spread on the substrate 11. In other words, as shown in a circle of FIG. 4(a), the droplets landing on the substrate 11 spread to have a diameter c larger than the size of one pixel. Here, since droplets are discharged at predetermined intervals (one pixel) in the Y-axis direction, the droplets arranged on the substrate 11 are set not to overlap with one another. Thus, the liquid material is prevented from being excessively formed on the substrate 11 in the Y-axis direction, and the occurrence of bulging can be prevented.

In addition, in FIG. 4(a), the droplets are arranged on the substrate 11 not to overlap with one another, but the droplets may be arranged to slightly overlap with one another. In addition, the droplets are discharged by opening one pixel, but the droplets may be discharged by opening intervals of two or more pixels. In this case, the number of scanning and discharge operations of the droplet discharge head 10 on the substrate 11 is increased so that an interval between the droplets on the substrate 11 is interpolated (filled).

Figure 4:
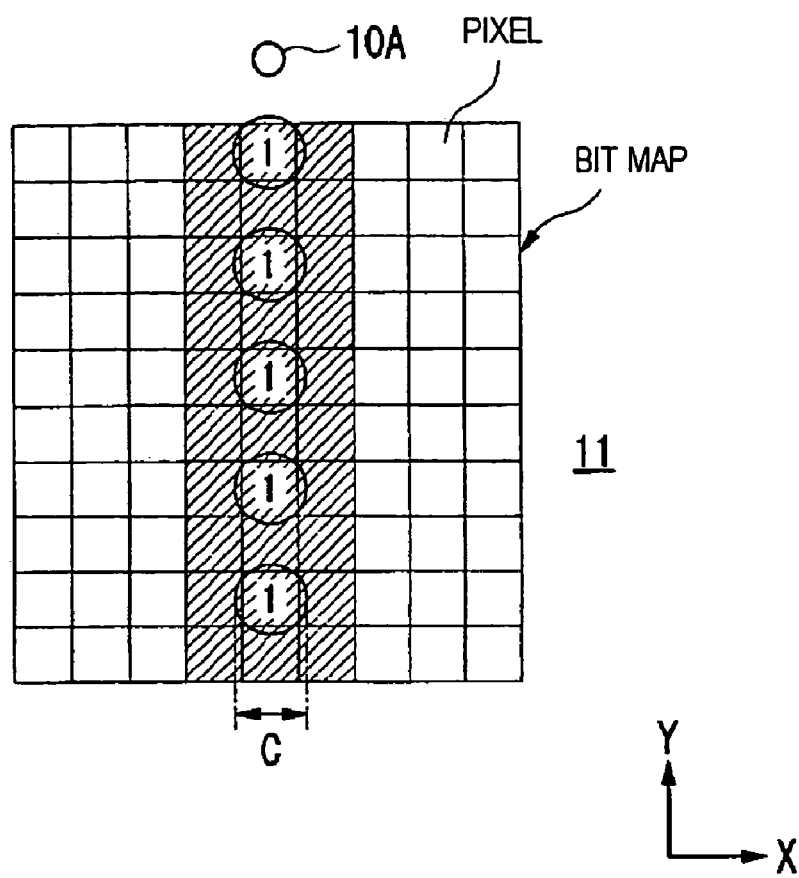
FIGS. 4A-B are mimetic diagrams illustrating a case where droplets are arranged on a substrate based on predetermined bit map data.
Figure 4:
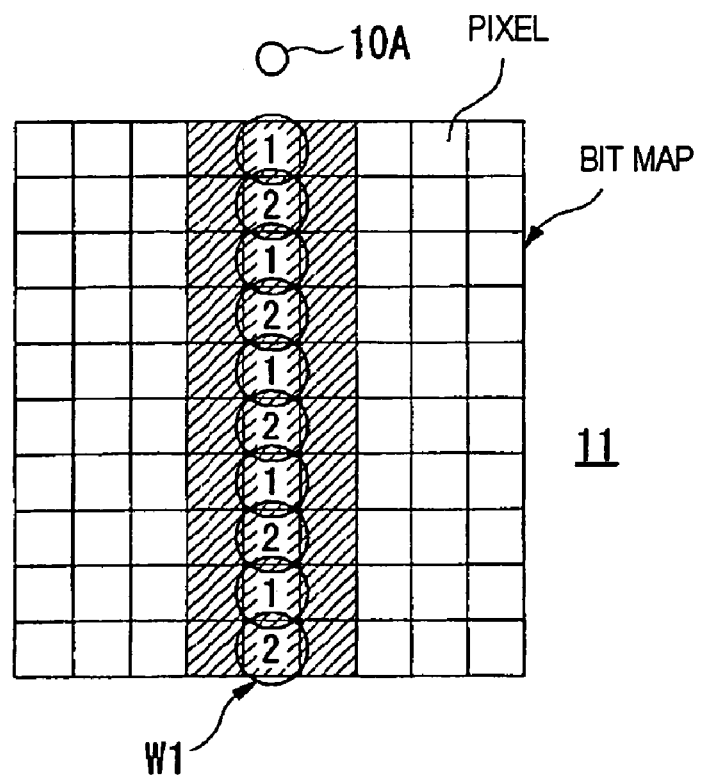

FIG. 4(*b*) is a mimetic diagram showing a case where droplets are discharged to the substrate 11 from the discharge nozzle 10A of the droplet discharge head 10 by second scanning. In addition, in FIG. 4(*b*), "2" is given to the droplets discharged during the second scanning. During the second scanning, the droplets are discharged to interpolate (fill) an interval between the droplets 1 discharged during the first scanning. By performing the first and second scanning and discharge operations, the droplets are continuously discharged (aligned), and the central pattern W1 is formed.

Figure 5:
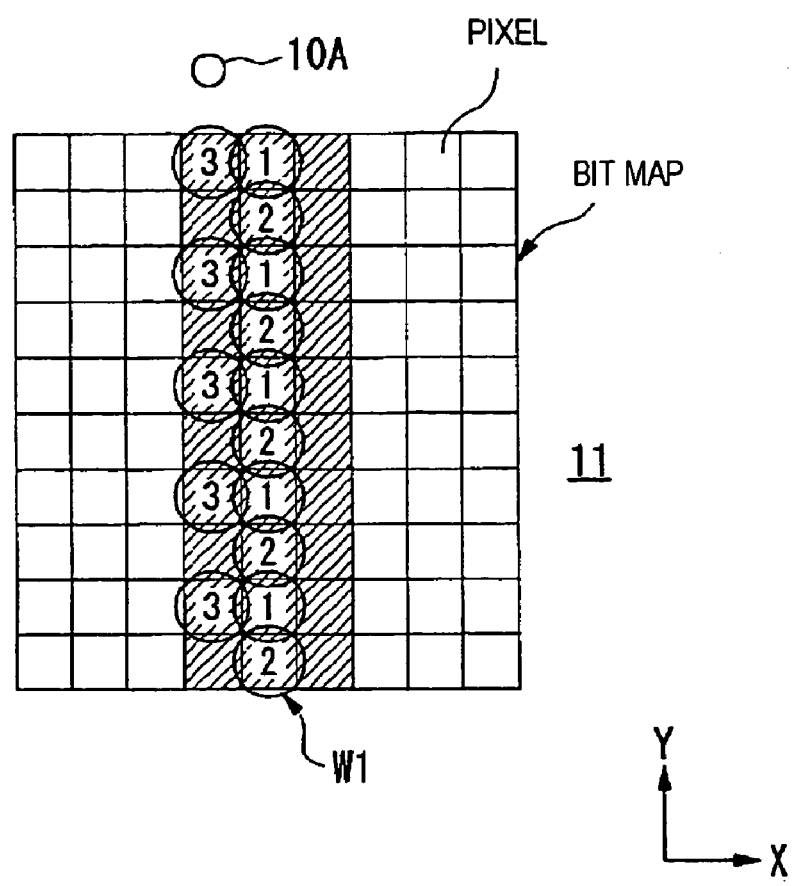
FIGS. 5A-B are mimetic diagrams illustrating a case where droplets are arranged on a substrate based on predetermined bit map data.
Figure 5:
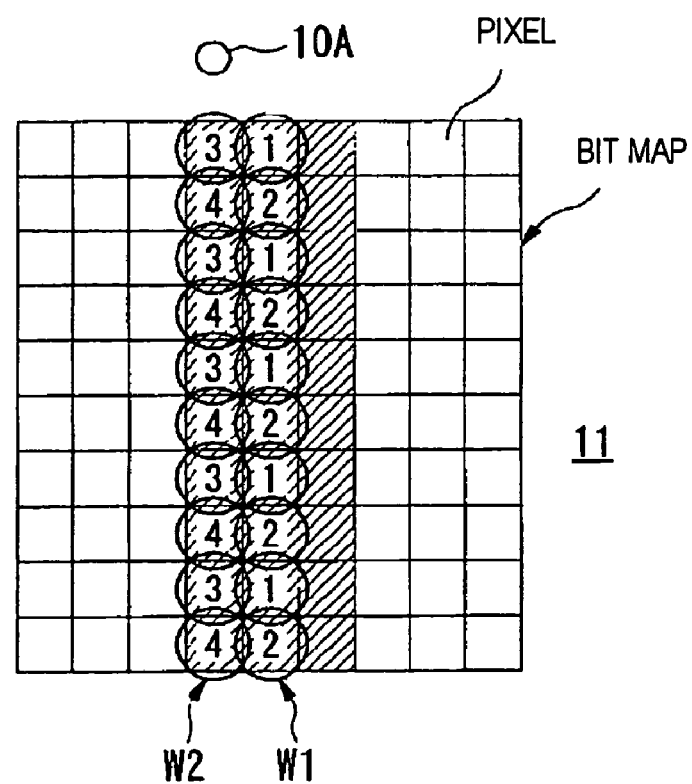

Next, the droplet discharge head 10 is moved relative to the substrate 11 in an X-axis direction by the distance of one pixel. Here, the droplet discharge head 10 makes a stepwise movement with respect to the substrate 11 in the X-axis direction by the distance of one pixel. Then, the droplet discharge head 10 performs third scanning. As a result, as shown in FIG. 5(*a*), the droplets 3 to form the first side pattern W2 are arranged on the substrate 11 to be adjacent to an X-side of the central pattern W1. Here, the droplets 3 are arranged by opening one pixel in the Y-axis direction. Here, the droplets 3 during the first side scanning (that is, the third scanning in the whole operation) after the stepwise movement of the droplet discharge head 10 in the X-axis direction are arranged in positions adjacent to the droplets 1 during the first scanning before the stepwise movement in the X-axis direction.

FIG. 5(*b*) is a mimetic diagram showing a case where droplets are discharged to the substrate 11 from the droplet discharge head 10 by fourth scanning. In addition, in FIG. 5(*b*), "4" is given to the droplets discharged during the fourth scanning. During the fourth scanning, the droplets are discharged to interpolate (fill) an interval between the droplets 3 discharged during the third scanning. Then, by performing the third and fourth scanning and discharge operations, the droplets are continuously discharged (aligned), and the first side pattern W2 is formed. Here, the droplets 4 during the second side scanning (that is, the fourth scanning in the whole operation) after the stepwise movement are arranged in positions adjacent to the droplets 2 during the second scanning before the stepwise movement in the X-axis direction.

Next, the droplet discharge head 10 is moved relative to the substrate 11 in the X-axis direction by the distance of two pixels.

Figure 6:
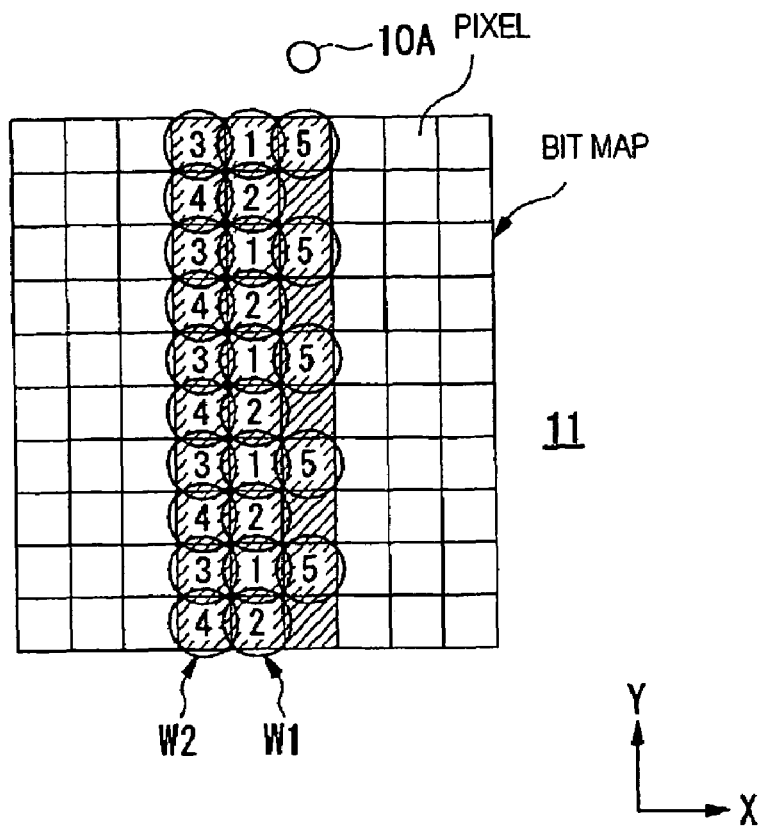
FIGS. 6A-B are mimetic diagrams illustrating a case where droplets are arranged on a substrate based on predetermined bit map data.
Figure 6:
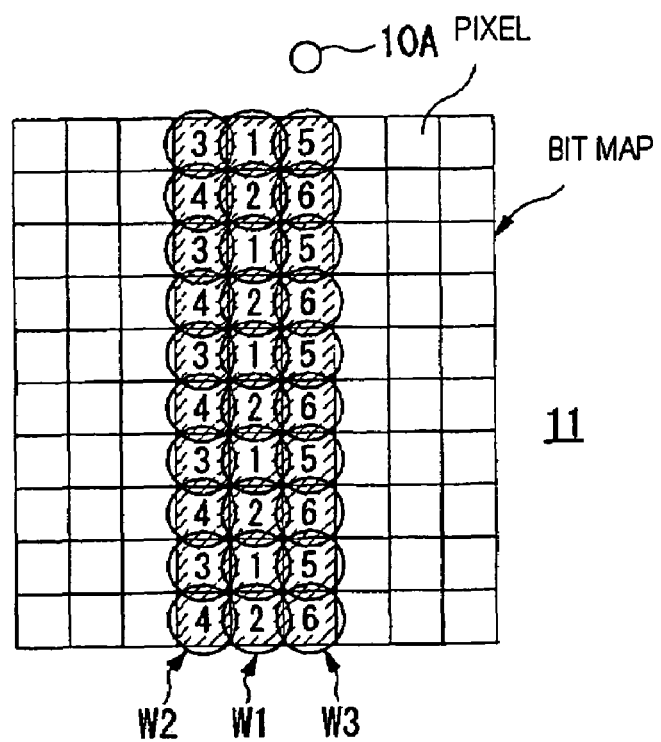

Here, the droplet discharge head 10 makes a stepwise movement with respect to the droplet discharge head 10 in a +X-direction by the distance of two pixels. Then, the droplet discharge head 10 performs fifth scanning. As a result, as shown in FIG. 6(*a*), the droplets 5 to form the second side pattern W3 are arranged on the substrate 11 to be adjacent to a +X-side of the central pattern W1. Here, the droplets 5 are arranged by opening one pixel in the Y-axis direction. Here, the droplets 5 during the fifth scanning after the stepwise movement in the X-axis direction of the droplet discharge head 10 are arranged in positions adjacent to the droplets 1 in the X-axis direction.

FIG. 6(*b*) is a mimetic diagram showing a case where droplets are discharged to the substrate 11 from the droplet discharge head 10 by sixth scanning. In addition, in FIG. 6(*b*), "6" is given to the droplets discharged during the sixth scanning. During the sixth scanning, the droplets are discharged to interpolate (fill) an interval between the droplets 5 discharged during the fifth scanning. Then, by performing the fifth and sixth scanning and discharge operations, the droplets are continuously discharged, and the second side pattern W3 is formed. Here, the droplets 6 during the sixth scanning are arranged in positions adjacent to the droplets 2 in the X-axis direction.

Figure 7:
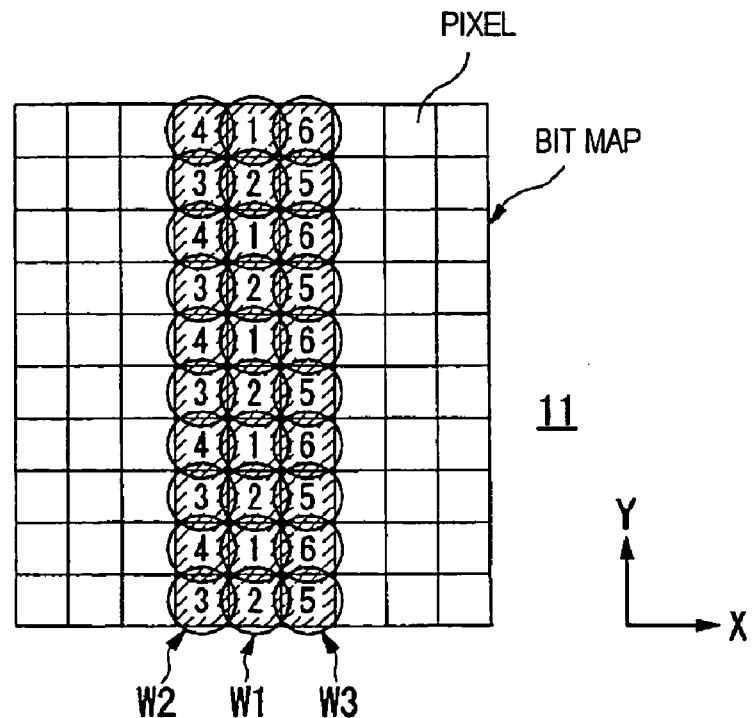
FIG. 7 is a mimetic diagram illustrating a case where droplets are arranged on a substrate based on predetermined bit map data according to another embodiment of the present invention.

FIG. 7 is a diagram showing an example in which the arrangement order of discharge positions of droplets is changed. In FIG. 7, droplets 4 discharged during the second side scanning (the fourth scanning in the whole operation) after the stepwise movement of the droplet discharge head 10 in the X-direction, are arranged in positions adjacent to the droplets 1 to form the central pattern W1 in the X-axis direction. On the other hand, droplets 3 discharged during the first side scanning (the third scanning in the whole operation) after the stepwise movement of the droplet discharge head 10 in the X-axis direction, are arranged in positions adjacent to the droplets 2 to form the central pattern W1 in the X-axis direction. Similarly, droplets 6 discharged during the sixth scanning in the whole operation are arranged in positions adjacent to the droplets 1 in a +X-axis direction. On the other hand, droplets 5 discharged during the fifth scanning in the whole operation are arranged in positions adjacent to the droplets 2 to form the central pattern W1 in the +X-axis direction. In this way, when forming each line W1, W2, or W3, each of the order of discharge positions of the droplets may be set differently in each line.

Figure 8:
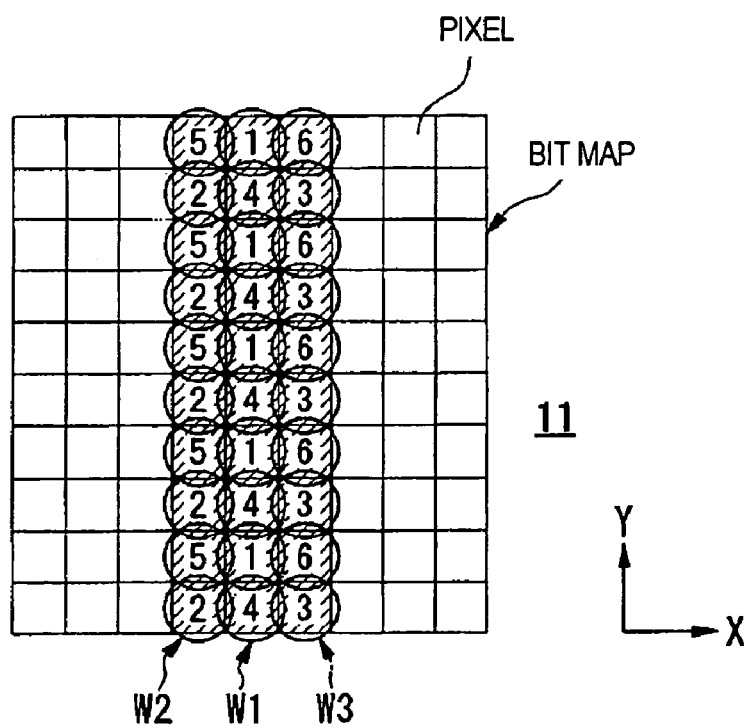
FIG. 8 is a mimetic diagram illustrating a case where droplets are arranged on a substrate based on predetermined bit map data according to another embodiment of the present invention.

Furthermore, as shown in the example of FIG. 8, after droplets 1 to form the central pattern W1 may be arranged, the droplet discharge head 10 may make a stepwise movement, and droplets 2 to form the first side pattern W2 may be arranged, and then, the droplet discharge head 10 may make a stepwise movement, and droplets 3 to form the second side pattern W2 may be arranged. The droplets 4, 5, and 6 are sequentially discharged to interpolate an interval therebetween. In this way, when forming the side patterns W2 and W3 after forming the central pattern W1, for example, after the central pattern W1 is completely formed, the side patterns W2 and W3 are not formed but the operation for forming the side patterns W2 and W3 may begin in a state where the central pattern W1 is not completely formed.

Figure 9A:
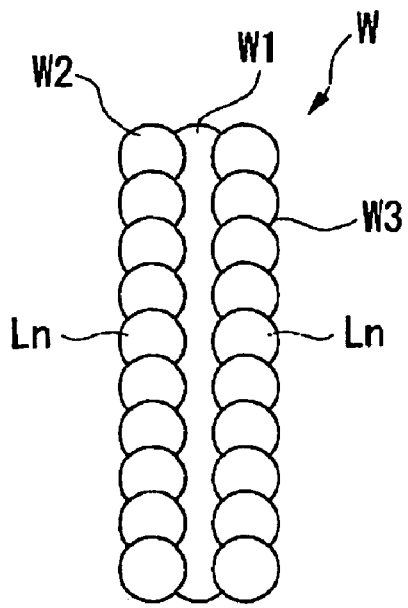
FIGS. 9A-B are mimetic diagrams illustrating a pattern forming method according to another embodiment of the present invention.
Figure 9B:
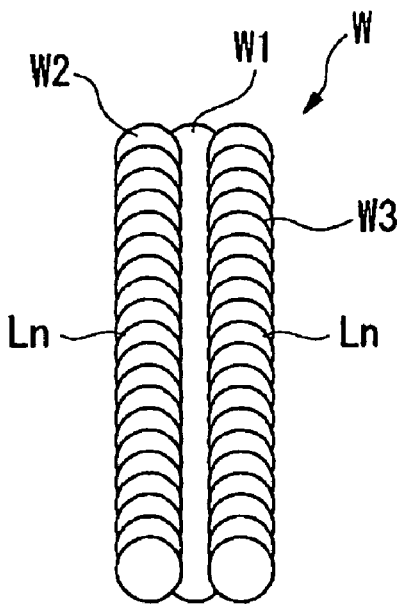

FIGS. 9(*a*) and 9(*b*) are diagrams showing arrangement examples of droplets to form the first and second side patterns W2 and W3 at both sides of a central pattern W1 in the second and third steps. In the example of FIG. 9(*a*), the central pattern W1 is formed under the conditions that are the same as the discharge conditions (arrangement conditions) described with reference to FIG. 3. Meanwhile, the discharge conditions (arrangement conditions) for the second and third steps are different from the discharge conditions for forming the central pattern W1. Specifically, the volume of droplets Ln is set to be larger than that in the first step. In other words, the amount of a liquid material discharged at one time is increased.

In addition, in the present embodiment, the arrangement pitch of the droplets Ln is the same as that in the first step. By increasing the volume of the droplets Ln, the total time taken for forming a film pattern W can be reduced, and the throughput can be increased. However, if the volume of droplets is increased, bulging easily occurs. Thus, conditions for the volume of droplets in which bulging does not occur, are obtained in advance according to properties of a liquid material, and the maximum volume of the discharged droplets is set based on the obtained conditions.

In the embodiment of FIG. 9(*b*), according to the discharge conditions for the second and third steps, the arrangement pitch of the droplets Ln is set to be smaller than the arrangement pitch in the first step. In addition, the volume of the droplets Ln may be set to be the same as or larger than that in the first step, as shown in FIG. 9(a). By setting the arrangement pitch of the droplets to be smaller, the amount of arrangement of the droplets per unit area increases, and patterns can be formed in a short time.

In addition, in the present embodiment, a variety of materials, such as a glass, a quartz glass, a Si wafer, a plastic film, and a metallic plate may be used as a substrate for conductive film wiring. In addition, a semiconductor film, a metallic film, a dielectric film, or an organic film may be formed as a base layer on the surface of the substrate formed of the variety of materials.

In the present embodiment, a dispersion solution (liquid material) in which conductive particles are dispersed in a dispersion medium, is used as the liquid material for conductive film wiring, and it does not matter whether the dispersion solution is watery or oily. Here, particles, such as conductive polymer or superconductor, other than metallic particles containing any one of gold, silver, copper, palladium, and nickel, are used as the conductive particles. In order to improve dispsersibility, organic materials are coated on the surface of the conductive particles, and the coated organic materials may be used as the conductive particles. For example, an organic solvent, such as xylene or toluene, or citric acid may be used as a coating material for coating organic materials on the surface of the conductive particles.

It is preferable that the diameter of the conductive particles be greater than or equal to 5 nm and less than or equal to 0.1 μm. If the diameter of the conductive particles is greater than 0.1 μm, clogging may occur in a nozzle of the droplet discharge head. In addition, if the diameter of the conductive particles is less than 5 nm, the volume ratio of the coating material to the conductive particles becomes large, and the ratio of an organic material in an obtained film becomes excessive.

It is preferable that the dispersion medium of liquid containing the conductive particles has a vapor pressure at a room temperature greater than or equal to 0.001 mmHg and less than or equal to 200 mmHg (greater than or equal to about 0.133 Pa and less than or equal to 26600 Pa). If the vapor pressure is greater than 200 mmHg, the dispersion medium is rapidly vaporized after discharge, and it becomes difficult to form a good film. In addition, it is more preferable that the dispersion medium has a vapor pressure greater than or equal to 0.001 mmHg and less than or equal to 50 mmHg (greater than or equal to about 133 Pa and less than or equal to 6650 Pa). If the vapor pressure is greater than 50 mmHg, when droplets are discharged using an ink-jet method, clogging in a nozzle caused by drying may occur easily. Meanwhile, if the dispersion medium has a vapor pressure less than 0.001 mmHg, drying is performed late, and the dispersion medium easily remains in the film, and it is difficult to obtain a good conductive film after the following heat/light treatment.

The dispersion medium is not particularly limited, but any dispersion medium may be used if it can disperse the conductive particles and does not cause cohesion. For example, other than water, alcohols such as methanol, ethanol, propanol, or butanol; hydrocarbon compounds, such as n-heptane, n-octane, decane, toluene, xylene, cymene, durene, indene, dipentene, tetrahydronaphthalene, decahydronaphthalene, and cyclohexylbenzene; ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methylethyl ether, 1,2-dimethoxyethane, bis(2-methoxyethyl)ether, and p-dioxane, and polar compounds such as propylene carbornate, γ-butyrolatone, N-methyl-2-pyrrolidone, dimethylformamide, dimethyl sulfoxide, and cyclohexanone may be used as the dispersion medium. Among the above dispersion mediums, due to the dispsersibility of particles, stability of a dispersion solution, and easy application to an ink-jet method, water, alcohols, hydrocarbon compounds, and ether compounds are preferably used, and more preferably, water and hydrogen compounds are used. Single compounds may be used as the dispersion medium, or two or more mixtures may be used as the dispersion medium.

The concentration of a dispersoid when the conductive particles are dispersed in the dispersion medium, is greater than or equal to 1 mass percent or less than or equal to 80 mass percent. The concentration of the dispersoid is adjusted according to the thickness of a conductive film. In addition, if the concentration of the dispersoid exceeds 80 mass percent, cohesion may easily occur, and it is difficult to obtain a uniform film.

It is preferable that the surface tension of the dispersion solution of the conductive particles be greater than or equal to 0.02 N/m and less than or equal to 0.07 N/m. When droplets are discharged using the inkjet method, if the surface tension is less than or equal to 0.02 N/m, the wettability of an ink composition on a nozzle surface increases. Therefore, curved flight easily occurs. If the surface tension exceeds 0.07 N/m, the shape of a meniscus at a nozzle tip is not stabilized. Therefore, it is difficult to control the discharge amount of droplets or the discharge timing of droplets.

In order to adjust the surface tension, a small amount of a surface tension regulator, such as a fluorine system, a silicon system, or a nonionic system, is added to the dispersion solution within the range that does not lower a contact angle with a substrate greatly.

The nonionic surface tension regulator is helpful to improve wettability of the liquid to the substrate, to improve leveling property of a film, and to prevent the occurrence of fine unevenness of the film. If necessary, the dispersion solution may include organic compounds, such as alcohols, ether, ester, and ketone.

It is preferable that the viscosity of the dispersion solution be greater than or equal to 1 mPa·s and less than or equal to 50 mPa·s. When a liquid material is discharged as the droplets using the ink-jet method, if the viscosity of the dispersion solution is less than 1 mPa·s, the peripheral portion of a nozzle is easily contaminated by the outflow of ink, and if the viscosity of the dispersion solution is less than 50 mPa·s, the frequency of clogging in a nozzle port is increased, and it is difficult to discharge droplets.

Surface Treatment Step

Next, surface treatment steps S2 and S3 shown in FIG. 1 will be described. In the surface treatment steps, the surface of a substrate for forming conductive film wiring is treated to have a lyophobic property against a liquid material (step S2).

Specifically, surface treatment is performed on the substrate so that a predetermined contact angle with respect to the liquid material containing conductive particles is greater than or equal to 60 deg, and preferably, greater than or equal to 90 deg and less than or equal to 110 deg. For example, a method of forming a self-organized film on the surface of a substrate and a plasma treatment method may be used as a method of controlling a lyophobic property (wettability) of the surface.

In the method of forming a self-organized film, the self-organized film formed of an organic molecular film is formed on the surface of a substrate on which conductive film wiring is to be formed. The organic molecular film for treating the surface of the substrate includes a functional group that can be combined with the substrate, a functional group called a lyophilic or lyophobic group and formed at a side opposite to the side in which the functional group is formed, which reforms a surface property (controlling a surface energy) of the substrate, and straight carbon chains used to combine these functional groups or partially-branched carbon chains. Thus, the organic molecular film is combined with the substrate and self organized so that a molecular film such as a monomolecular film is formed.

Here, the self-organized film is formed of a connective functional group that reacts to constituent atoms of a base layer of the substrate, and other linear chain molecule and is formed by aligning compounds having a very high alignment property by an interaction between the linear chain molecules. Since the self-organized film is formed by aligning single molecules, the layer thickness thereof can be made very small, and the self-organized film becomes a uniform film at a molecular level. In other words, since the same molecules are placed on the surface of the film, uniformity and excellent lyophobic property or lyophilic property can be given to the surface of the film.

Fluoroalkylsilane is used as the compounds having the very high alignment property, and each compound is aligned so that a fluoroalkyl group is placed on the surface of the film. As a result, the self-organized film is formed, and a uniform lyophobic property is given to the surface of the film.

Fluoroalkylsilane (hereinafter, referred to as FAS) such as (heptadecafluoro-1,1,2,2-tetrahydrodecyl)triethoxysilane, (heptadecafluoro-1,1,2,2-tetrahydrodecyl)trimethoxysilane, (heptadecafluoro-1,1,2,2-tetrahydrodecyl)trichlorosilane, (tridecafluoro-1,1,2,2-tetrahydrooctyl) triethoxysilane, (tridecafluoro-1,1,2,2-tetrahydrooctyl)trimethoxysilane, (tridecafluoro-1,1,2,2-tetrahydrooctyl)trichlorosilane, and trifluoropropyltrimethoxysilane, may be used as compounds to form the self-organized film. Single compounds may be used, or two or more compounds may be combined with one another. In addition, through the use of FAS, an adhering property with the substrate and a good lyophobic property can be obtained.

In general, FAS is represented by a structural formula $RnSiX(4-n)$. Here, n is an integer greater than or equal to 1 and less than or equal to 3, and X is a hydrolysis group such as a methoxy group, an ethoxy group, and halogen atoms. In addition, R is a fluoroalkyl group and has a structure of $(CF3)(CF2)x(CH2)y$ (where x is an integer greater than or equal to 0 and less than or equal to 10, and y is an integer greater than or equal to 0 and less than or equal to 4). When a plurality of R or X are combined with Si, R or X may be respectively the same as or different from each other. The hydrolysis group represented by X forms silanol by hydrolysis, reacts to a hydroxyl group of the base of a substrate (glass or silicon), and is combined with the substrate by siloxane combination. Meanwhile, since R has a fluoro group, such as CF3, on the surface of the substrate, the base surface of the substrate is reformed on an un-wet surface (having a low surface energy).

The self-organized film formed of an organic molecular film is formed on the substrate by putting the raw material compounds and the substrate in the same airtight container and leaving them alone at a room temperature for two or three days. In addition, the airtight container is maintained at 100° C. for about three hours. The above method is a method of forming the self-organized film from vapor, but the self-organized film may be formed from liquid. For example, the self-organized film is formed on the substrate by dipping the substrate in a solution including raw material compounds and cleaning and drying the substrate. In addition, it is preferable that before forming the self-organized film, previous treatment of the surface of the substrate is performed by irradiating the surface of the substrate with ultraviolet light or cleaning the substrate using a solvent.

After FAS treatment, if necessary, lyophobic property lowering treatment is performed (step S3) so that the surface of the substrate has a desire lyophobic property. In other words, when FAS treatment is performed as lyophobic treatment, the action of the lyophobic property is so strong that a substrate and a film pattern W formed on the substrate may be easily peeled off. In this case, treatment for lowering (adjusting) the lyophobic property is performed. Ultraviolet (UV) irradiation treatment having a wavelength of about 170 to 400 nm may be used as treatment for lowering the lyophobic property. By irradiating the substrate with ultraviolet rays having a predetermined power for a predetermined period of time, the lyophobic property of the substrate on which FAS treatment is performed is lowered, and the substrate has a desired lyophobic property. Alternatively, by exposing the substrate to an ozone atmosphere, the lyophobic property of the substrate can be controlled.

Meanwhile, in the plasma treatment method, the substrate is plasma-irradiated under atmospheric pressure or in a vacuum state. A variety of gases may be selected as gases used in plasma treatment in consideration of the surface material of the substrate on which conductive film wiring is to be formed. For example, 4 fluoromethane, perfluorohexane, or perfluorodecane may be used as treatment gases.

In addition, treatment for processing the surface of the substrate with a lyophobic property may be performed by attaching a film with a desired lyophobic property, for example, a 4 fluoroethylene-processed polyimide film to the surface of the substrate. In addition, a polyimide film having a high lyophobic property may be used as the substrate.

Intermediate Drying Step

Next, an intermediate drying step S5 of FIG. 1 will be described. In the intermediate drying step (heat/light treatment step), a dispersion medium or a coating material contained in droplets arranged on a substrate is removed. In other words, the dispersion medium of a liquid material for forming a conductive film arranged on the substrate needs to be completely removed so as to improve electrical contact between particles. In addition, when the surf particles is coated with a coating material such, as an organic matter, so as to improve the dispsersibility thereof, the coating material needs to be removed.

In general, heat/light treatment is performed in the air, and if necessary, in an inert gas atmosphere, such as nitrogen, argon, or helium. The temperature required for heat/light treatment is properly determined in consideration of the boiling point (vapor pressure) of the dispersion medium, the type or pressure of an atmosphere gas, thermal behavior such as dispsersibility or an oxidizability of particles, the existence or amount of a coating material, and a heat-resistant temperature of a material. For example, in order to remove the coating material formed of an organic material, the substrate needs to be baked at a high temperature of about 300° C. In addition, in the case of using a substrate formed of plastics, it is preferable that the substrate be baked at over a room temperature and at a temperature less than or equal to 100° C.

A heating apparatus, such as a hot plate or an electric furnace may be used in the heat treatment. Lamp annealing may be used in the light treatment. A light source of light used in lamp annealing is not limited, but an infrared lamp, a xenon lamp, a YAG laser, an argon laser, a carbonic acid gas laser, or an excimer laser such as XeF, XeCl, XeBr, KrF, KrCl, ArF, or ArCl, may be used as the light source. In general, these light sources having an output greater than or equal to 10 W and less than or equal to 5000 W are used, but in the present embodiment, light sources having greater than or equal to 100 W and less than or equal to 1000 W may be well used. Electrical contact between particles is obtained by the heat/light treatment, and a dispersion solution is changed into a conductive film.

In addition, in this case, even though there is no difficulty in increasing the degree of heating or light scanning for removing the dispersion medium and changing the dispersion solution into the conductive film, it is sufficient to remove some of the dispersion medium sufficiently. For example, in the case of heat treatment, in general, heating may be performed at about 100° C. for a few minutes. In addition, drying treatment may be simultaneously performed with discharge of the liquid material. For example, the substrate is heated in advance, or the dispersion medium having a low boiling point is used with cooling of a droplet discharge head so that drying of droplets can be performed immediately after the droplets are arranged on the substrate.

Through the above-described steps, a linear conductive film pattern is formed on the substrate. In the method of forming conductive film wiring of the present embodiment, even though there is a limitation to the line width that can be formed at one time, a plurality of linear patterns are integrated with each other, and the line width can be enlarged. Therefore, a conductive film pattern whose electrical conductivity is good and in which a disconnection or short circuit of a wiring portion hardly occur, can be formed.

Pattern Forming Apparatus

Figure 10:
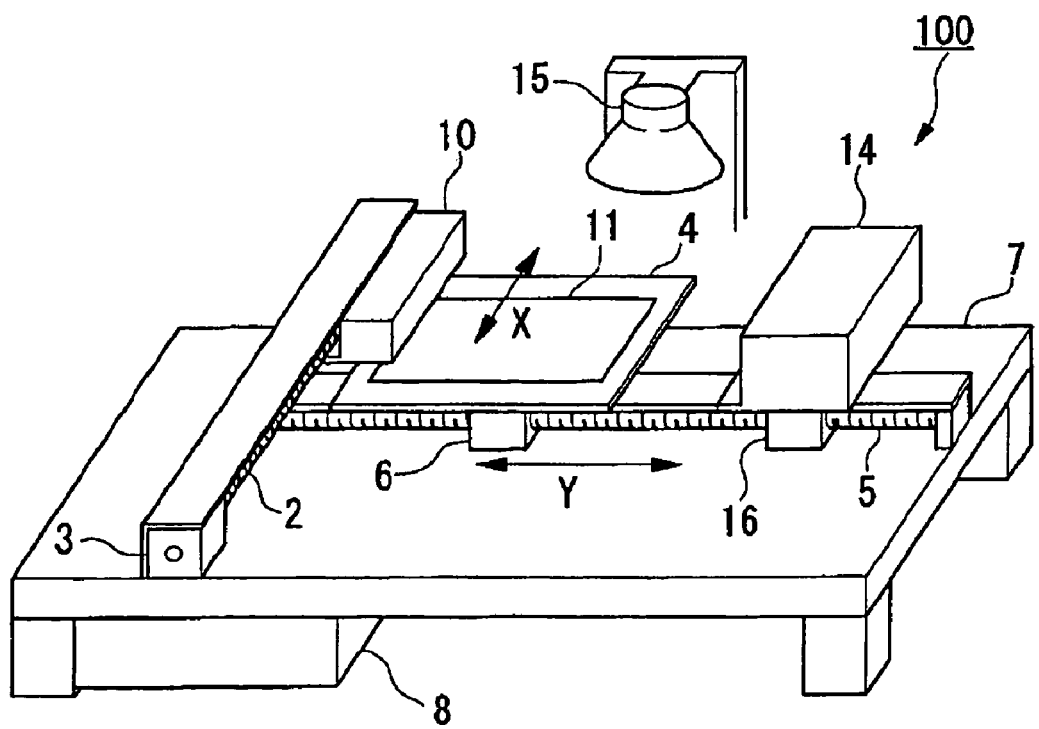
FIG. 10 is a schematic perspective view illustrating a pattern forming apparatus according to an embodiment of the present invention.

Next, an example of a pattern forming apparatus according to the present invention will be described with reference to FIG. 10. FIG. 10 is a schematic perspective view of a pattern forming apparatus according to an embodiment of the present invention. As shown in FIG. 10, a pattern forming apparatus 100 includes a droplet discharge head 10, an X-direction guide shaft 2 for driving the droplet discharge head 10 in an X-direction, an X-direction driving motor 3 for rotating the X-direction guide shaft 2, a mount 4 for mounting a substrate 11 thereon, a Y-direction guide shaft 5 for driving the mount 4 in a Y-direction, a Y-direction driving motor 6 for rotating the Y-direction guide shaft 5, a cleaning mechanism 14, a heater 15, and a controller 8 for controlling the elements. The X-direction guide shaft 2 and the Y-direction guide shaft 5 are fixed on a base 7. In addition, even though the droplet discharge head 10 is arranged to be perpendicular to an advancing direction of the substrate 11, the angle of the droplet discharge head 10 may be adjusted so that the droplet discharge head 10 may intersect the advancing direction of the substrate 11. In this way, the pitch between nozzles can be adjusted by adjusting the angle of the droplet discharging head 10. In addition, the distance between a nozzle surface and the substrate 11 can be arbitrarily adjusted.

The droplet discharge head 10 discharges a liquid material formed of a dispersion solution containing conductive particles through a nozzle discharge (outlet) and is fixed on the X-direction guide shaft 2. The X-direction driving motor 3 is a stepping motor, and if a driving pulse signal in an X-axis direction is supplied from the controller 8 to the X-direction driving motor 3, the X-direction driving motor 3 rotates the X-direction guide shaft 2. By rotation of the X-direction guide shaft 2, the droplet discharge head 10 moves in the X-axis direction with respect to the base 7.

Droplet discharge methods may include a variety of well-known techniques such as a piezo-method of discharging ink using a piezo-element that is a piezoelectric element, and a bubble method of discharging a liquid material through bubbles generated from the heated liquid material. In the piezo-method, since heat is not applied to the liquid material, the composition of the material is not affected by the piezo-method. In addition, because of a high degree of freedom in selection of the liquid material and good control of the droplets, the piezo-method is used in the present embodiment.

The mount 4 is fixed on the Y-direction guide shaft 5, and Y-direction driving motors 6 and 16 are connected to the Y-direction guide shaft 5. The Y-direction driving motors 6 and 16 are stepping motors, and if a driving pulse signal in a Y-axis direction is supplied from the controller 8 to the Y-direction driving motors 6 and 16, the Y-direction driving motors 6 and 16 rotate the Y-direction guide shaft 5. By rotation of the Y-direction guide shaft 5, the mount 4 moves in the Y-axis direction with respect to the base 7. The cleaning mechanism 14 cleans the droplet discharge head 10 and prevents clogging of a nozzle. The cleaning mechanism 14 moves along the Y-direction guide shaft 5 by the Y-direction driving motor 16 during cleaning. The heater 15 heats the substrate 11 using heating means, such as lamp annealing, performs vaporization/drying of discharged liquid on the substrate 11, and performs heat treatment for changing a dispersion solution into a conductive film.

In a pattern forming apparatus 100 according to the present embodiment, the droplet discharge head 10 is moved relative to the substrate 11 with the aid of the X-direction driving motor 3 and the Y-direction driving motor 6 while liquid material is discharged from the droplet discharge head 10, so that the liquid material is arranged on the substrate 11. The amount of a droplet discharged through each nozzle of the droplet discharge head 10 is adjusted by a voltage supplied from the controller 8 to the piezo-element. In addition, the pitch of the droplets arranged on the substrate 11 is adjusted by the speed of movement of the droplet discharge head relative to the substrate and the discharge frequency from the droplet discharge head 10 (frequency of a driving voltage supplied to the piezo-element). In addition, positions in which the droplets are arranged on the substrate 11 is adjusted by the direction of the relative movement and by timing control of discharge start of the droplets from the droplet discharge head 10 during relative movement. As a result, the above-described conductive film pattern for wiring is formed on the substrate 11.

Electro-Optical Device

Figure 11:
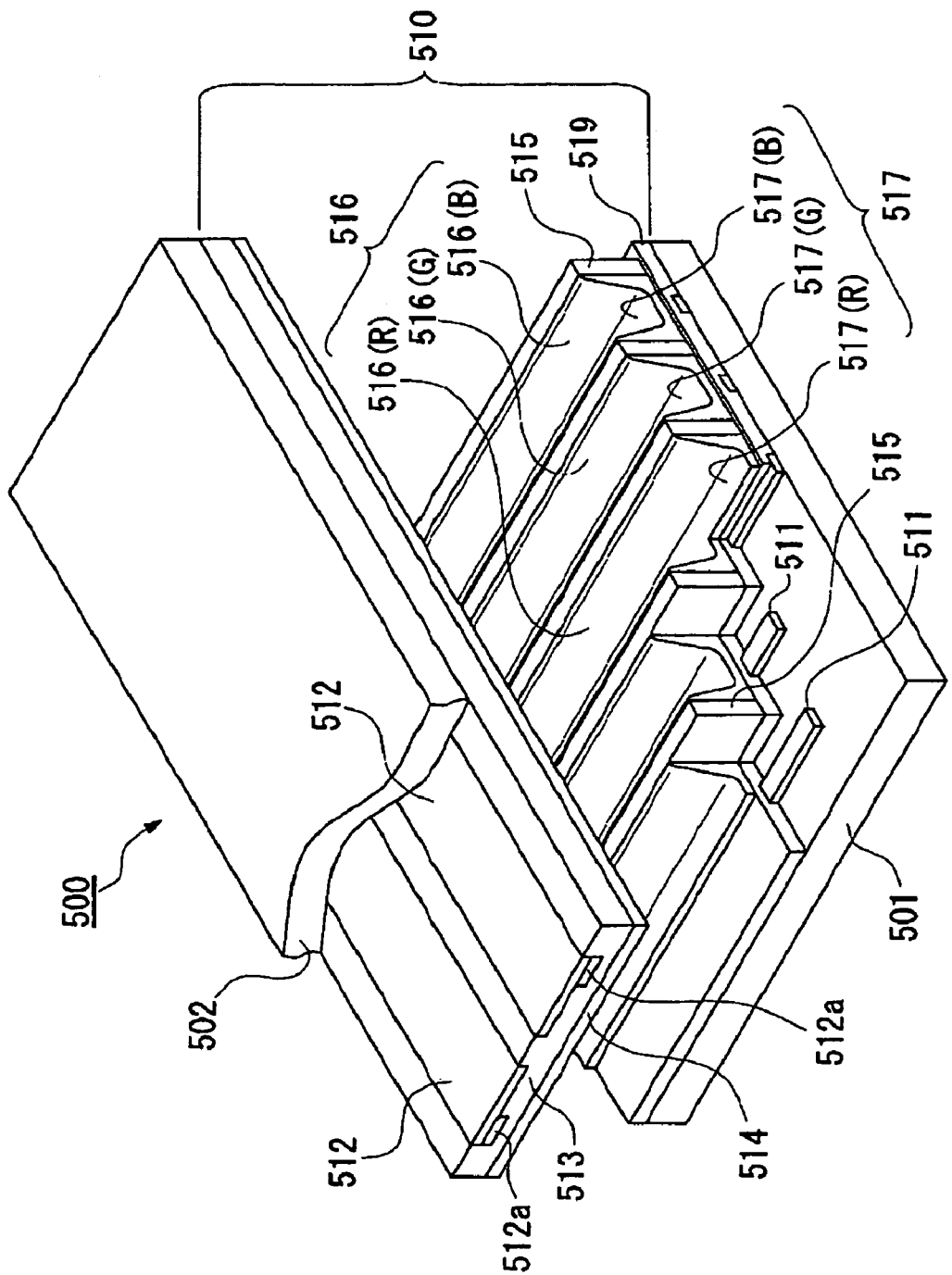
FIG. 11 illustrates an electro-optical device according to an embodiment of the present invention and is an exploded perspective view illustrating an example to which a plasma display device is applied.

Next, a plasma display device as an example of an electro-optical device according to the present invention will be described. FIG. 11 is an exploded perspective view of a plasma display device 500 according to the present embodiment. The plasma display device 500 includes substrates 501 and 502 arranged to be opposite to each other, and a discharge display unit 510 formed therebetween. The discharge display unit 510 is formed of a plurality of discharge chambers 516. Three discharge chambers, such as a red discharge chamber 516(R), a green discharge chamber 516(G), and a blue discharge chamber 516(B), of the plurality of discharge chambers 516 are paired to form one pixel.

Address electrodes 511 are formed on the top face of the substrate 501 in a stripe shape at predetermined intervals, and a dielectric layer 519 is formed to cover the address electrodes 511 and the top face of the substrate 501. Partition walls 515 are formed on the dielectric layer 519 to be positioned between address electrodes 511 and run along each address electrode 511. Each partition wall 515 includes a partition portion adjacent to the widthwise right and left sides of the address electrode 511 and a partition portion that extends in a direction perpendicular to the address electrode 511. In addition, a discharge chamber 516 is formed to correspond to a rectangular region partitioned by the partition wall 515. In addition, a fluorescent material 517 is arranged inside the rectangular region partitioned by the partition wall 515. The fluorescent material 517 emits fluorescence having one of red, green, blue colors, and a red fluorescent material 517(R) is arranged at the bottom of the red discharge chamber 516 (R), a green fluorescent material 517(G) is arranged at the bottom of the green discharge chamber 516(G), and a blue fluorescent material 517(B) is arranged at the bottom of the blue discharge chamber 516(B).

Meanwhile, a plurality of display electrodes 512 are formed on the substrate 502 in a stripe shape at predetermined intervals in a direction perpendicular to the previous address electrodes 511. Further, a dielectric layer 513 and a protection layer 514 formed of MgO are formed to cover the plurality of display electrodes 512. The substrate 501 and the substrate 502 are opposite to each other and are attached to each other so that the display electrodes 512 . . . are perpendicular to the address electrodes 511 . . . . The address electrodes 511 and the display electrodes 512 are connected to an AC power source (not shown). A current flows through each electrode so that the fluorescent material 517 is excited to emit light in the discharge display unit 510, thereby allowing color display.

In the present embodiment, the address electrodes 511 and the display electrodes 512 are respectively formed by the pattern forming method of FIGS. 1 to 9 using the pattern forming apparatus of FIG. 10. Therefore, troubles such as a disconnection or short circuit of each wiring, do not occur, and it is easy to make the electro-optical device such as the plasma display device, smaller and thinner.

Figure 12:
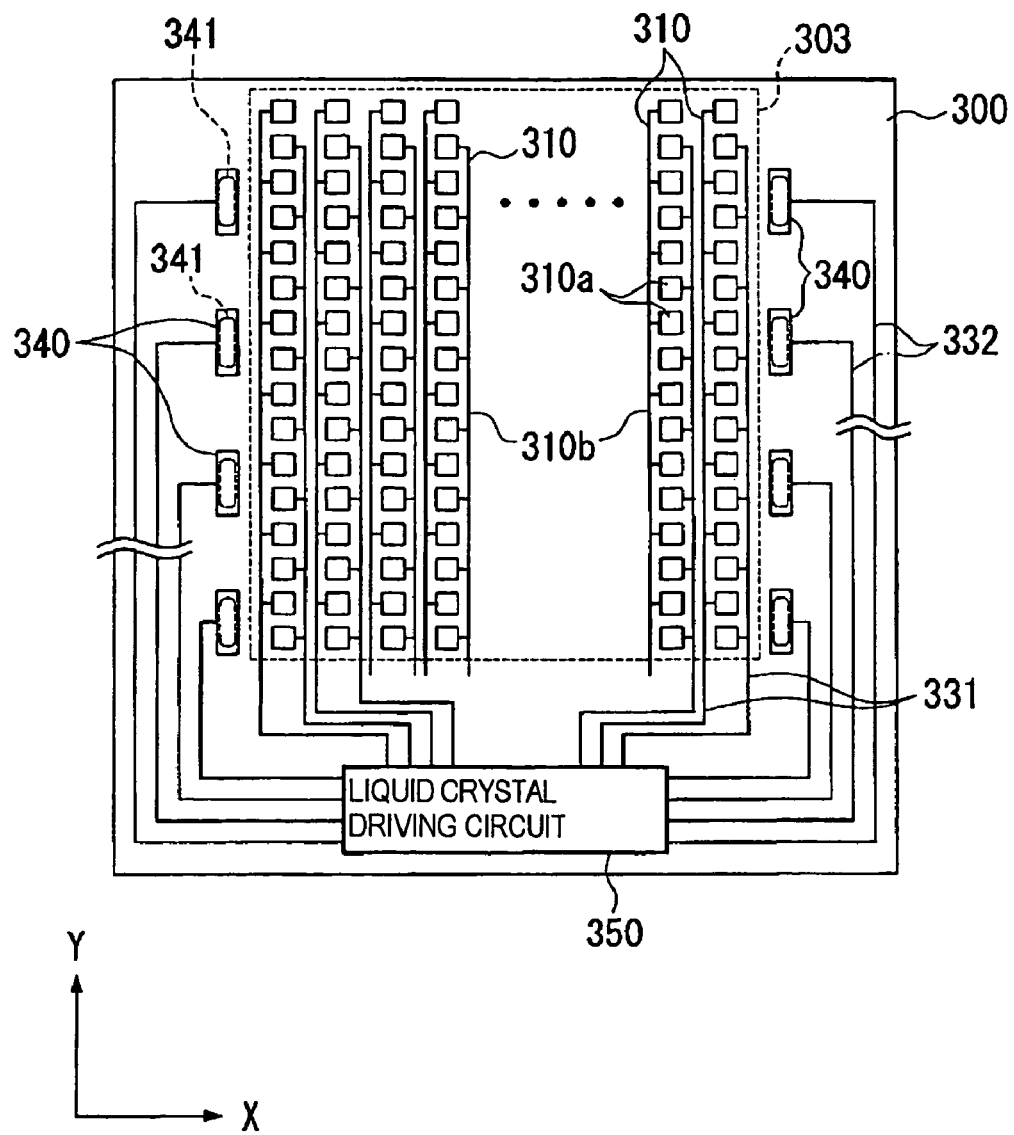
FIG. 12 illustrates an electro-optical device according to an embodiment of the present invention and is a plan view illustrating an example to which a liquid crystal display device is applied.

Next, a liquid crystal device as another example of the electro-optical device according to the present invention will be described. FIG. 12 shows a plan layout of a signal electrode on a first substrate of the liquid crystal device according to the present embodiment. The liquid crystal device according to the present embodiment generally includes the first substrate, a second substrate (not shown) on which scanning electrodes are formed, and liquid crystal (not shown) enclosed between the first substrate and the second substrate.

As shown in FIG. 12, a plurality of signal electrodes 310 . . . is provided in a multi-matrix in a pixel region 303 on the first substrate 300. In particular, the respective signal electrodes 310 . . . include a plurality of pixel electrode portions 310*a* . . . corresponding to respective pixel and signal wiring portions 310*b* . . . for connecting the pixel electrode portions 310*a* . . . in the multi-matrix and extend in a Y-direction. In addition, reference numeral 350 denotes a liquid crystal driving circuit having a one-chip structure. The liquid crystal driving circuit 350 is connected to one end (lower side in FIG. 12) of each of the signal wiring portion 310*b* . . . via first pull-in wiring 331 . . . . In addition, reference numeral 340 . . . denotes up-down conducting terminals. The up-down conducting terminals 340 . . . and terminals (not shown) formed on the second substrate are connected to each other by up-down conducting materials 341 . . . . In addition, the liquid crystal driving circuit 350 and the up-down conducting terminals 340 . . . are connected to each other via a second pull-in wiring 332 . . . .

In the present embodiment, the respective signal wiring portions 310*b* . . . , the first pull-in wiring 331 . . . , and the second pull-in wiring 332 . . . , which are formed on the first substrate 300, are formed by the pattern forming method described referring to FIGS. 1 to 9 using the pattern forming apparatus as shown in FIG. 10. For this reason, troubles such as a disconnection or short circuit of the wiring, do not occur, and it is easy to make the electro-optical device such as the plasma display device, smaller and thinner. In addition, even when manufacturing a large-sized liquid crystal substrate, a wiring material can be effectively used, and costs can be reduced. In addition, a device to which the present invention can be applied is not limited to the electro-optical device, and the present invention can be applied to manufacturing other devices, such as a circuit board on which conductive film wiring is formed, or mounting wiring of a semiconductor.

Next, a liquid crystal display device as an electro-optical device according to another embodiment of the present invention will be described.

Figure 13:
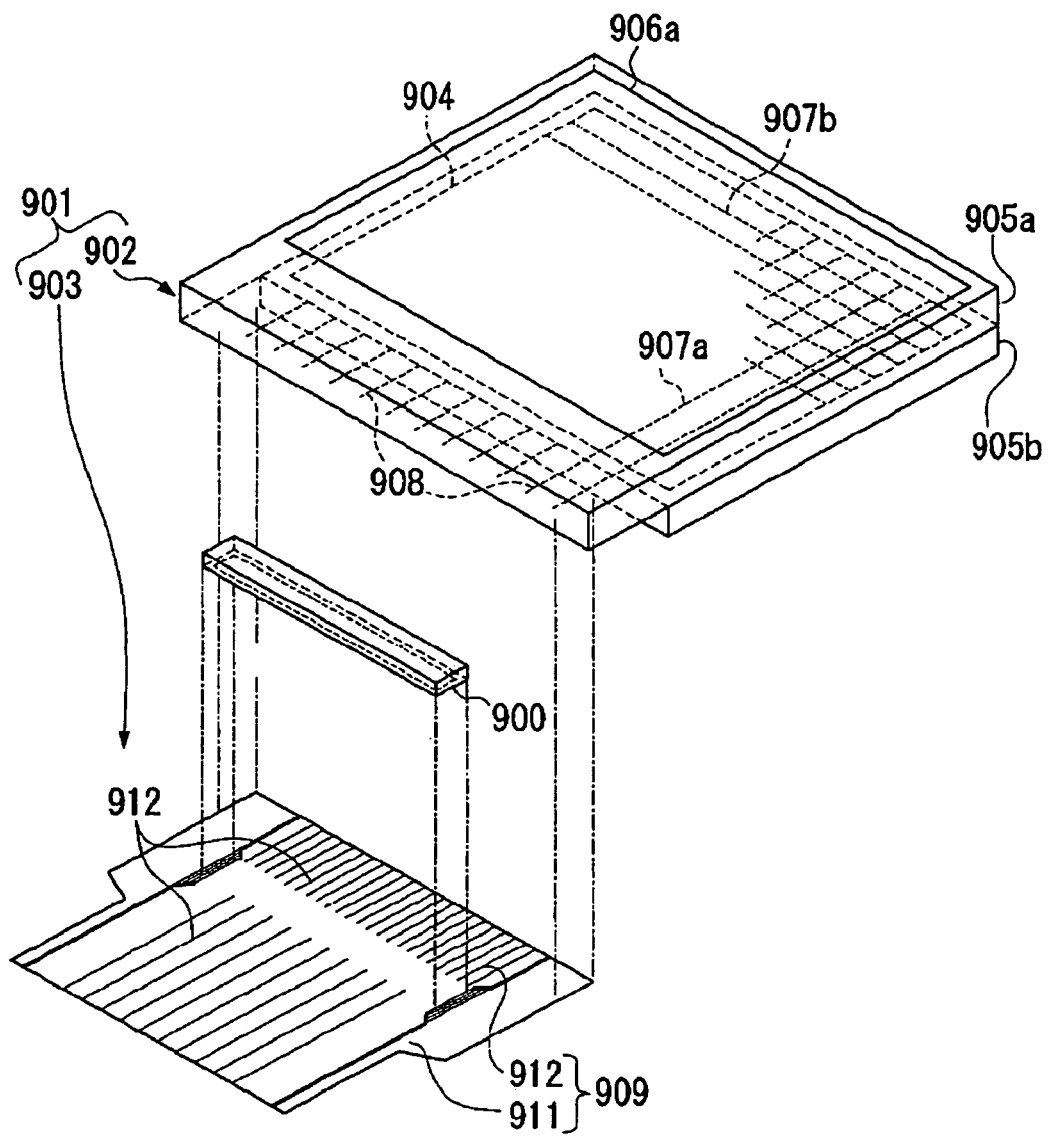
FIG. 13 shows another embodiment of the liquid crystal display device.

A liquid crystal device (electro-optical device) 901 of FIG. 13 largely includes a color liquid crystal panel (electro-optical panel) 902 and a circuit board 903 connected to the liquid crystal panel 902. In addition, if necessary, an illuminator, such as a backlight and other auxiliary devices, are provided in the liquid crystal panel 902.

The liquid crystal panel 902 includes a pair of substrates 905*a* and 905*b* bonded to each other using a sealing material 904, and liquid crystal is filled in a gap called a cell gap between the substrates 905*a* and 905*b*. In general, the substrates 905*a* and 905*b* are formed of a light-transmitting material, for example, glass or synthetic resin. Polarizing plates 906*a* and 906*b* are attached to the outer surfaces of the substrates 905*a* and 905*b*, respectively. In addition, the polarizing plate 906*b* is omitted in FIG. 13.

In addition, electrodes 907*a* are formed on the inner surface of the substrate 905*a*, and electrodes 907*b* are formed on the inner surface of the substrate 905*b*. The electrodes 907*a* and 907*b* are formed in a stripe, character, number, or other proper pattern. In addition, the electrodes 907*a* and 907*b* are formed of a light-transmitting material such as indium tin oxide (ITO). The substrate 905*a* includes a protruding portion with respect to the substrate 905*b*, and a plurality of terminals 908 are formed in the protruding portion. The terminals 908 are formed simultaneously with the electrode 907*a* when the electrode 907*a* is formed on the substrate 905*a*. Thus, the terminals 908 are formed of ITO, for example. The terminals 908 include terminals extending integrally from the electrodes 907*a* and terminals connected to the electrodes 907*b* via a conductive material (not shown).

A semiconductor element 900 which is a liquid crystal driving IC, is mounted in a predetermined position on a wiring board 909 of the circuit board 903. In addition, although not shown, a resistor, a storage capacitor, and other chip components may be mounted in the predetermined position of a portion other than a portion on which the semiconductor element 900 is mounted. The wiring board 909 is manufactured by patterning a metallic layer such as Cu formed on a base substrate 911 having flexibility, such as polyimide, and by forming a wiring pattern 912.

In the present embodiment, the electrodes 907*a* and 907*b* of the liquid crystal panel 902 and the wiring pattern 912 of the circuit board 903 are formed by the method of forming a device.

According to the liquid crystal device of the present embodiment, a high-quality liquid crystal display device in which non-uniformity of electric characteristics is removed can be obtained.

In addition, the above-described example is a passive liquid crystal panel, but may be an active-matrix liquid crystal panel. In other words, a thin film transistor (TFT) is formed on one substrate, and a pixel electrode is formed on each TFT. In addition, wiring (gate wiring and source wiring) electrically connected to each TFT can be formed using an ink-jet technique as described above. Meanwhile, a counter electrode is formed on a counter substrate. The present invention can be applied to the active-matrix liquid crystal panel.

Next, a field emission display (FED) having a field emission element (electron emission element) of an electro-optical device according to another embodiment of the present invention will be described.

Figure 14:
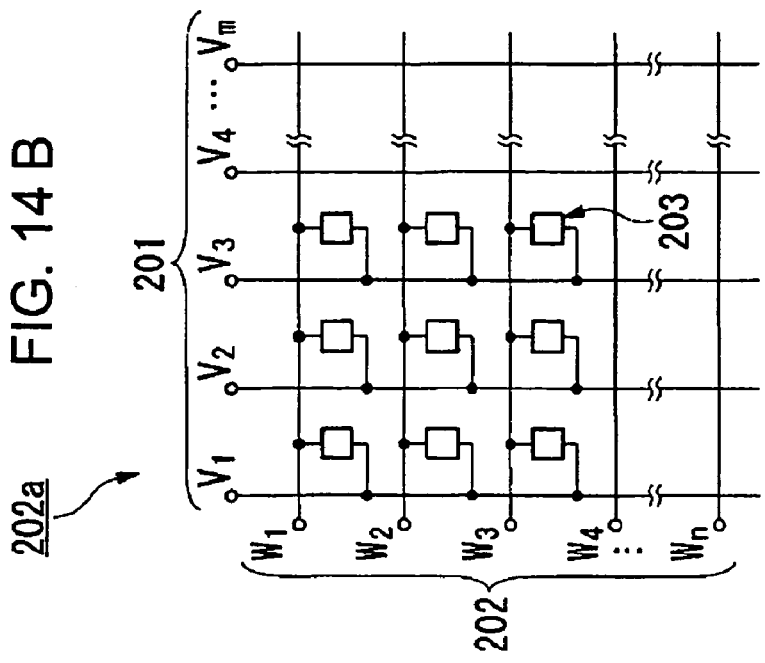
FIGS. 14A-C are a views illustrating a Field Emission Display (an FED).
Figure 14:
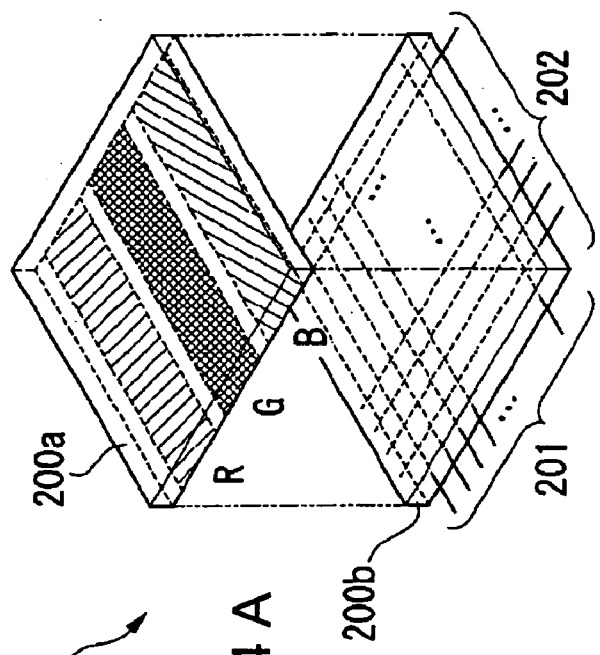
Figure 14:
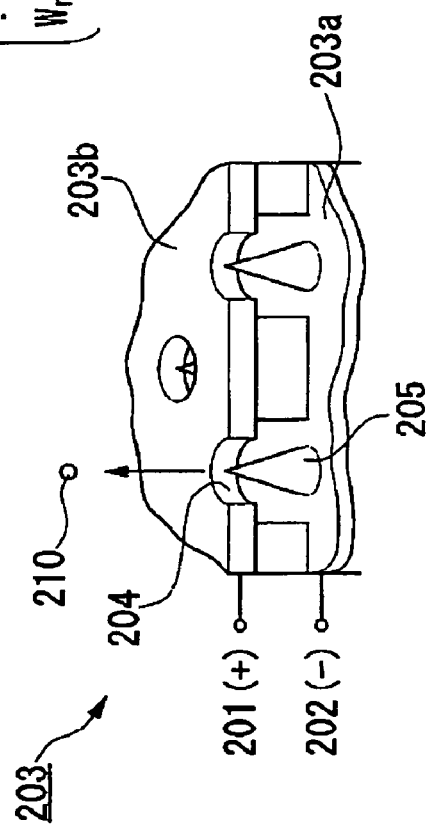

FIGS. 14A-C are views illustrating the FED. FIG. 14(a) schematically shows the arrangement of a cathode substrate and an anode substrate that constitute the FED. FIG. 14(b) is a mimetic diagram of a driving circuit of the cathode substrate of the FED. FIG. 14(c) is a perspective view of a main part of the cathode substrate.

As shown in FIG. 14(a), an FED (electro-optical device) 200 has a structure in which the cathode substrate 200a and the anode substrate 200b are arranged opposite to each other. As shown in FIG. 14(b), the cathode substrate 200a includes a gate line 201, an emitter line 202, and a field emission element 203 connected to the gate line 201 and the emitter line 202. In other words, the cathode substrate 200a becomes a so-called simple matrix driving circuit. Gate signals V1, V2, . . . , and Vm are supplied to the gate line 201, and emitter signals W1, W2, . . . , and Wn are supplied to the emitter line 202. In addition, the anode substrate 200b includes a fluorescent material formed of R, G, and B and has a property in which electrons hit a corresponding fluorescent material to emit light.

As shown in FIG. 14(c), the field emission element 203 includes an emitter electrode 203a connected to the emitter line 202 and a gate electrode 203b connected to the gate line 201. Further, the emitter electrode 203a has a protrusion called an emitter tip 205 whose diameter becomes smaller from the emitter electrode 203a to the gate electrode 203b, and a hole 204 is formed in the gate electrode 203b in a position corresponding to the emitter tip 205, and a tip of the emitter tip 205 is arranged in the hole 204.

With regard to the FED 200, gate signals V1, V2, . . . , and Vm of the gate line 201 and emitter signals W1, W2, . . . , and Wn of the emitter line 202 are controlled so that a voltage is supplied between the emitter electrode 203a and the gate electrode 203b, an electron 210 moves toward the hole 204 from the emitter tip 205 by electrolytic action, and the electron 210 is emitted from the tip of the emitter tip 205. Here, since the corresponding electron 210 is hit on the fluorescent material of the anode substrate 200b to emit light, a desired FED 200 can be driven.

With regard to the FED having the above structure, for example, the emitter electrode 203a or the emitter line 202, or the gate electrode 203b or the gate line 201 is formed by the method of forming a device.

According to the FED of the present embodiment, a high-quality FED in which non-uniformity of electric characteristics is removed can be obtained.

Electronic Apparatus

Figure 15:
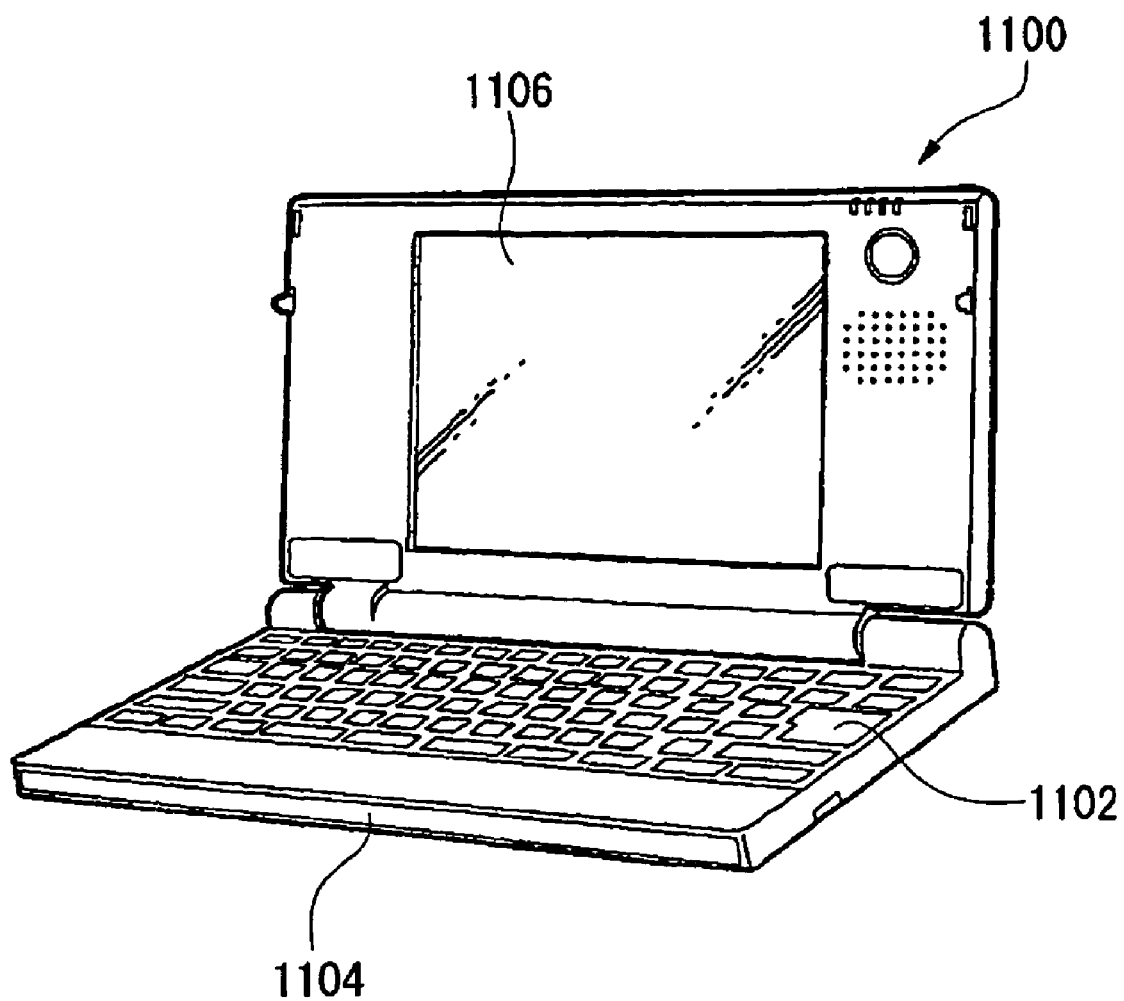
FIG. 15 illustrates another embodiment of an electronic apparatus according to the present invention.

Next, an example of an electronic apparatus according to the present invention will be described. FIG. 15 is a perspective view showing the structure of a mobile personal computer (information processor) having a display device according to the above-described embodiment. In FIG. 15, the personal computer 1100 includes a main body 1104 having a keyboard 1102 and a display device unit having the above-described electro-optical device 1106. Thus, an electronic apparatus having a high luminous efficiency and a bright display unit can be provided.

In addition to the above-described example, as other examples, the electronic apparatus includes a mobile telephone, a wrist watch electronic apparatus, a liquid crystal TV, a video tape recorder of view finder type or monitor direct-viewing type, a car navigation apparatus, a pager, an electronic note, an electronic calculator, a word processor, a workstation, a television telephone, a POS terminal, an electronic paper, and an apparatus having a touch panel. The electro-optical device according to the present invention can also be applied to a display unit of the electronic apparatus. In addition, the electronic apparatus according to the present embodiment includes an electronic apparatus having other electro-optical devices having a liquid crystal device, an organic electroluminescent display device, and a plasma display device.

As described above, although preferred embodiments of the present invention has been particularly shown and described with reference to the accompanying drawings, it goes without saying that the present invention is not limited to the embodiments as shown and described. Various shapes or combinations of the respective elements as shown in the above-described embodiments are just examples, and various changes may be made depending on design requirements without departing from the spirit of the present invention.

What is claimed is:

1. A pattern forming method for forming a linear film pattern by arranging droplets of a liquid material on a substrate, the method comprising:
    a first step of arranging the droplets, whose width is smaller than that of the film pattern, on the substrate and forming a central part of the film pattern by depositing a plurality of first droplets spaced apart from each other on the substrate and depositing second droplets in spaces between the first droplets;
    a second step of arranging the droplets, whose width is smaller than that of the film pattern, on the substrate and forming one side with respect to the formed central part by depositing a plurality of third droplets spaced apart from each other on the substrate and depositing fourth droplets in spaces between the third droplets; and
    a third step of arranging the droplets, whose width is smaller than that of the film pattern, on the substrate and forming the other side with respect to the formed central part by depositing a plurality of fifth droplets spaced apart from each other on the substrate and depositing sixth droplets in spaces between the fifth droplets.

2. The pattern forming method according to claim 1, wherein the droplets are arranged on the substrate so that the droplets overlap with at least a part of the central part formed on the substrate to form the sides.

3. The pattern forming method according to claim 1, wherein arrangement conditions of the droplets in the first, second, and third steps are set differently.

4. The pattern forming method according to claim 3, wherein the arrangement intervals of the droplets on the substrate in the first, second, and third steps are set to different values.

5. The pattern forming method according to claim 3, wherein the volumes of the droplets in the first, second, and third steps are set to different values.

6. The pattern forming method according to claim 1, further comprising a surface treatment step of adjusting a lyophobic property of the surface of the substrate before arranging the droplets on the substrate.

7. The pattern forming method according to claim 1, wherein the liquid material comprises conductive particles.

8. A method of manufacturing a device having a linear wiring pattern comprising a material arrangement step of arranging droplets of a liquid material on a substrate,
    wherein the material arrangement step comprises:
    a first step of arranging the droplets, whose width is smaller than that of the wiring pattern, on the substrate and forming a central part of the wiring pattern by depositing a plurality of first droplets spaced apart from each other on the substrate and depositing second droplets in spaces between the first droplets;

a second step of arranging the droplets, whose width is smaller than that of the wiring pattern, on the substrate and forming one side with respect to the formed central part by depositing a plurality of third droplets spaced apart from each other on the substrate and depositing fourth droplets in spaces between the third droplets; and a third step of arranging the droplets, whose width is smaller than that of the wiring pattern, on the substrate and forming the other side with respect to the formed central part by depositing a fifth plurality of droplets spaced apart from each other on the substrate and depositing sixth droplets in spaces between the fifth droplets.

9. A pattern forming method for forming a film pattern by arranging droplets of a liquid material on a substrate, the method comprising:

a first step of discharging a plurality of linearly spaced apart first droplets in an elongated central part of the film pattern on the substrate and thereafter discharging a set of linearly spaced apart second droplets on the substrate, the second droplets filling in gaps between the first droplets;

a second step of discharging a plurality of linearly spaced apart third droplets along a first side of the formed central part, the third droplets partially overlapping the formed central part and thereafter discharging a set of linearly spaced apart fourth droplets on the substrate, the fourth droplets filling in gaps between the third droplets; and a third step of discharging a plurality of linearly spaced apart fifth droplets along a second side of the formed central part, the fifth droplets partially overlapping the formed central part and thereafter discharging a set of linearly spaced apart sixth droplets on the substrate, the sixth droplets filling in gaps between the fifth droplets.

10. The pattern forming method of claim 9 wherein:
the third droplets partially overlap the first droplets; and
the fourth droplets partially overlap the second droplets.

11. The pattern forming method of claim 9 wherein:
the fifth droplets partially overlap the first droplets; and
the sixth droplets partially overlap the second droplets.

* * * * *

UNITED STATES PATENT AND TRADEMARK OFFICE
CERTIFICATE OF CORRECTION

PATENT NO. : 7,582,333 B2  Page 1 of 1
APPLICATION NO. : 10/797591
DATED : September 1, 2009
INVENTOR(S) : Hirai et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1238 days.

Signed and Sealed this

Fourteenth Day of September, 2010

David J. Kappos
*Director of the United States Patent and Trademark Office*